(12) United States Patent
Zhang et al.

(10) Patent No.: US 11,689,220 B2
(45) Date of Patent: *Jun. 27, 2023

(54) METHOD AND DEVICE FOR INTERLEAVING DATA

(71) Applicant: HUAWEI TECHNOLOGIES CO., LTD., Guangdong (CN)

(72) Inventors: Gongzheng Zhang, Hangzhou (CN); Ying Chen, Hangzhou (CN); Yunfei Qiao, Hangzhou (CN); Yourui Huangfu, Hangzhou (CN); Rong Li, Hangzhou (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/563,573

(22) Filed: Dec. 28, 2021

(65) Prior Publication Data

US 2022/0123766 A1 Apr. 21, 2022

Related U.S. Application Data

(63) Continuation of application No. 16/796,300, filed on Feb. 20, 2020, now Pat. No. 11,265,018, which is a (Continued)

(30) Foreign Application Priority Data

Jun. 16, 2017 (CN) .......................... 201710459439.4

(51) Int. Cl.
*H03M 13/00* (2006.01)
*H03M 13/13* (2006.01)
(Continued)

(52) U.S. Cl.
CPC ........... *H03M 13/13* (2013.01); *H03M 13/09* (2013.01); *H04L 1/0013* (2013.01);
(Continued)

(58) Field of Classification Search
None
See application file for complete search history.

(56) References Cited

U.S. PATENT DOCUMENTS 5,844,918 A 12/1998 Kato
6,931,581 B1 8/2005 Cassiday et al.
(Continued)

FOREIGN PATENT DOCUMENTS

CN 1864422 A 11/2006
CN 102035617 4/2011
(Continued)

OTHER PUBLICATIONS

3GPP TS 38.212 V0.0.0, 3rd Generation Partnership Project, Technical Specification Group Radio Access Network, NR, Multiplexing and channel coding (Release 15), May 2017, 10 pages.
(Continued)

*Primary Examiner* — Mujtaba M Chaudry
(74) *Attorney, Agent, or Firm* — Fish & Richardson P.C.

(57) ABSTRACT

Embodiments of this application provide a method for processing information bits in a wireless communication network. A device obtains a Polar encoded bit sequence, then divide the Polar encoded bit sequence into g groups that are of equal length N/g, wherein g is 32. The device block interleaves the g groups to obtain an interleaved bit sequence according to a sequence S, wherein the sequence S comprises: group numbers of the g groups, wherein a group whose number is 0 is the first element in the sequence S, wherein a group whose number is 12 is the $17^{th}$ element in the sequence S, wherein a group whose number is 31 is the
(Continued)

$32^{nd}$ element in the sequence S, wherein the S is an integer and output the interleaved bit sequence.

12 Claims, 14 Drawing Sheets

Related U.S. Application Data continuation of application No. 16/406,860, filed on May 8, 2019, now Pat. No. 10,608,668, which is a continuation of application No. PCT/CN2018/091835, filed on Jun. 19, 2018.

(51) Int. Cl.
*H03M 13/09* (2006.01)
*H04L 1/00* (2006.01)

(52) U.S. Cl.
CPC .......... *H04L 1/0057* (2013.01); *H04L 1/0068* (2013.01); *H04L 1/0071* (2013.01)

(56) References Cited

U.S. PATENT DOCUMENTS

| | | | | |
|---|---|---|---|---|
| 10,313,057 | B2* | 6/2019 | Lin | H03M 13/2906 |
| 2010/0185926 | A1 | 7/2010 | Lawson et al. | |
| 2012/0185757 | A1 | 7/2012 | Jeong et al. | |
| 2012/0297276 | A1 | 11/2012 | Gioulekas et al. | |
| 2013/0139025 | A1 | 5/2013 | Fotios et al. | |
| 2014/0208183 | A1* | 7/2014 | Mahdavifar | H03M 13/27 714/755 |
| 2015/0249473 | A1* | 9/2015 | Li | H03M 13/6356 341/51 |
| 2015/0295593 | A1* | 10/2015 | Trifonov | H03M 13/3746 714/776 |
| 2015/0333769 | A1 | 11/2015 | Jeong et al. | |
| 2015/0381208 | A1* | 12/2015 | Li | H03M 13/616 714/755 |
| 2016/0182187 | A1* | 6/2016 | Kim | H04L 1/0068 714/807 |
| 2017/0012740 | A1* | 1/2017 | Shen | H03M 13/13 |
| 2017/0012744 | A1* | 1/2017 | Shen | H04L 43/16 |
| 2017/0047947 | A1* | 2/2017 | Hong | H03M 13/2906 |
| 2018/0026663 | A1* | 1/2018 | Wu | H03M 13/618 714/776 |
| 2019/0296769 | A1 | 9/2019 | Zhang et al. | |

FOREIGN PATENT DOCUMENTS

| | | |
|---|---|---|
| CN | 105874737 A | 8/2016 |
| CN | 106817195 | 6/2017 |
| EA | 22652 | 2/2016 |
| KR | 20150131540 | 11/2015 |
| RU | 2580797 | 4/2016 |
| WO | 2017092543 A1 | 6/2017 |

OTHER PUBLICATIONS

Extended European Search Report issued in European Application No. 18817980.8 dated Feb. 5, 2020, 11 pages.

International Search Report and Written Opinion issued in International Application No. PCT/CN2018/091835 dated Sep. 10, 2018, 12 pages.

MediaTek Inc, "Polar Code Size and Rate-Matching Design for NR Control Channels" 3GPP TSG RAN WG1 RAN1 #88 Meeting, Agenda Item: 8.1.4.2.1, R.1-1702735, Athens, Greece, 13th-17th Feb. 13-17, 2017, 8 pages.

MediaTek Inc., "Comparison and optimization of Polar code rate matching," 3GPP TSG RAN WG1 RAN1 #88-Bis Meeting, R:-1704460, Spokane, USA, Apr. 3-7, 2017, 10 pages.

Niu et al., "Beyond turbo codes: rate-compatible punctured polar codes," IEEE ICC, 2013, 5 pages.

Office Action issued in Chinese Application No. 201910309698.8 dated Dec. 9, 2019, 3 pages.

Office Action issued in Korean Application No. 2020-7001131 dated May 6, 2021, 10 pages (with English translation).

Office Action issued in Russian Application No. 2020101281/07(001853) dated Sep. 27, 2021, 14 pages (with English translation).

Search Report issued in Chinese Application 201910309698.8 dated Nov. 29, 2019, 2 pages.

Wang et al., "A novel puncturing scheme for polar codes," IEEE Comm. Lett., vol. 18, No. 12, Dec. 2014, 4 pages.

ZTE, "Polar Codes Contruction and Rate Matching Scheme," 3GPP TSG RAN WG1 Meeting #89, R1-1707183, Hangzhou, China, May 15-19, 2017, 13 pages.

Office Action issued in Chinese Application No. 201710459439.4 dated Dec. 31, 2021, 27 pages (with English translation).

Office Action issued in Chinese Application No. 201710459439.4 dated Aug. 18, 2022, 6 pages (with English translation).

* cited by examiner

METHOD AND DEVICE FOR INTERLEAVING DATA

CROSS-REFERENCE TO RELATED APPLICATIONS

This application is a continuation of U.S. patent application Ser. No. 16/796,300, filed on Feb. 20, 2020, which is a continuation of U.S. patent application Ser. No. 16/406,860, filed on May 8, 2019, now U.S. Pat. No. 10,608,668, which is a continuation of International Application No. PCT/CN2018/091835, filed on Jun. 19, 2018, which claims priority to Chinese Patent Application No. 201710459439.4, filed on Jun. 16, 2017. All of the afore-mentioned patent applications are hereby incorporated by reference in their entireties.

TECHNICAL FIELD

Embodiments disclosed herein relate to the field of communication technologies, and in particular, to a method and device for interleaving data.

BACKGROUND

Channel encoding is used in communication systems to improve data transmission reliability, so as to ensure communication quality. A polar code, proposed by Professor Arikan of Turkish, is the first code that are theoretically proven to be able to achieve the Shannon capacity and having low encoding and decoding complexity. The polar code is a linear block code. A encoding matrix of the polar code is $G^N$, which is an N×N matrix. An encoding process for generating a polar code $x_1^N$ is $x_1^N = u_1^N G_N$, where $u_1^N = (u_1, u_2, \ldots, u_N)$ is a binary row vector having a length is N (N is also called a mother code length), and $G_N = F_2^{\otimes(\log_2(N))}$. $F_2^{\otimes(\log_2(N))}$ is a Kronecker product of $\log_2 N$ matrices $F_2$, and the matrix $F_2$ is:

$$F_2 = \begin{bmatrix} 1 & 0 \\ 1 & 1 \end{bmatrix}.$$

In the encoding process of the polar code, some bits in the row vector $u_1^N$ are used to carry information and these bits are referred to as information bits. An index set of the bits is represented as A. The other bits are set to a fixed value that is pre-agreed upon between a transmitting end and a receiving end of the polar code, and these bits are referred to as fixed bits or frozen bits. An index set of these bits is represented by $\mathcal{A}^c$, which is a complementary set of $\mathcal{A}$. The polar encoding process of the polar code is equivalent to $x_1^N = u_A G_N(A) \oplus u_{A^c} G_N(A^c)$. Herein, $G_N(A)$ is a submatrix formed by rows in the $G_N$ that correspond to indexes in the set A, and $G_N(A^c)$ is a submatrix formed by rows in the $G_N$ that correspond to indexes in the set $A^c$. $u_A$ is an information bit set of the $u_1^N$, and the number of the information bits is K; and $u_{A^c}$ is a frozen bit set of the $u_1^N$, the number of frozen bits is (N−K), and the frozen bits are known bits. Value of the frozen bits is normally set to 0, but the value of the frozen bits may be randomly set, provided that the transmitting end and the receiving end of the polar code have pre-agreed on the value of the frozen bits. When the frozen bits are set to 0, a polar code encoding output may be simplified as follows: $x_1^N = u_A G_N(\mathcal{A})$, in which $G_N(A)$ is a K×N matrix.

A process of constructing polar code is a process of selecting the set $\mathcal{A}$, and the selection of the set A determines performance of the polar code. The process of constructing polar code is usually as follows: determining, based on a mother code length N, that a total of N polarized channels, where each of the N polarized channels respectively correspond to one row in an encoding matrix, respectively; calculating a reliability of each of the polarized channels; and forming the information bit index set A using indexes of first K polarized channels with relatively high reliability, and forming the frozen bit index set $\mathcal{A}^c$ using indexes of the remaining (N−K) polarized channels. The set A determines bit positions of the information bits in $x_1^N$, and the set $\mathcal{A}^c$ determines bit position of the frozen bits in $x_1^N$.

It can be learned from the encoding matrix that a code length of an original polar code (mother code) is an integral power of 2. In practical applications, however, length of a polar code need to be set to any code length, and this is achieved by a process called rate matching.

SUMMARY

Embodiments of the application provides a method, an apparatus for rate matching, to implement a polar code with any code length.

According to a first aspect, embodiments of this application provide a method for a rate matching. The method includes:

obtaining a first encoded bit sequence, where the first encoded bit sequence includes g groups that are of equal length, a quantity of each group is N/g, N is a length of mother code of a polar code, N is an integral power of 2, g is an integer greater than or equal to 4 and less than N, and g is an integral power of 2, determining, based on the groups, a bit position of a bit that needs to be punctured/shortened in the encoded bit sequence; and obtaining a second encoded bit sequence after removing the bit that needs to be punctured/shortened from the first encoded bit sequence, wherein the second encoded bit sequence is a bit sequence obtained after rate matching.

According to a second aspect, embodiments of this application provide an apparatus for rate matching, including:

an obtaining unit, configured to obtain a first encoded bit sequence, where the encoded bit sequence includes g groups that are of equal length, a quantity of each group is N/g, N is a length of mother code, N is an integral power of 2, g is an integer greater than or equal to 4 and less than N, and g is an integral power of 2;

a first determining unit, configured to determine, based on the groups, a bit position of a bit that needs to be punctured/shortened in the first encoded bit sequence; and a rate matching unit, configured to obtain a second encoded bit sequence after removing the bit that needs to be punctured/shortened from the first encoded bit sequence, wherein the second encoded bit sequence is a bit sequence obtained after rate matching.

With reference to the first aspect, in a possible implementation, embodiments of this application further includes:

a second determining unit, configured to: when an actual code rate is greater than a preset threshold, rate matching manner is a shortening; or when the actual code rate is less than or equal to a preset threshold, rate matching manner is a puncturing, where the actual code rate is K/N, K is a length of information bits, and M is a length of target code.

With reference to the first aspect, in a possible implementation, embodiments of this application further includes:
an encoding unit, configured to: place a frozen bit in a polarized channel corresponding to the bit position of the bit that needs to be punctured/shortened; in remaining polarized channels, select a polarized channel with high reliability, place an information bit in the polarized channel with high reliability, and place frozen bits on the other polarized channels; and encode a to-be-coded bit by channel coding, to obtain the first encoded bit sequence.

According to a third aspect, a rate matching apparatus is provided, including:
a memory, configured to store a program; and
a processor, configured to execute the program stored in the memory, where when the program is executed, the processor is configured to perform the method for rate matching provided in the first aspect of the embodiments of this application.

According to a fourth aspect, embodiments of this application provide a method for a rate de-matching including:
obtaining a log-likelihood ratio (LLR) of a to-be-decoded bit sequence, to obtain an LLR bit sequence;
determining a bit position of puncturing/shortening based on groups; and
obtaining an LLR sequence according to an LLR value of a bit at the bit position of puncturing/shortening, where the LLR sequence includes g groups that are of equal length, a quantity of each group is N/g, N is a length of mother code of a polar code, N is an integral power of 2; g is an integer greater than or equal to 4 and less than N, and g is an integral power of 2.

According to a fifth aspect, embodiments of this application provide an apparatus for a rate de-matching, including:
an obtaining unit, configured to obtain a log-likelihood ratio (LLR of a to-be-decoded bit sequence;
a determining unit, configured to determine a bit position of puncturing/shortening based on groups; and
a rate de-matching unit, configured to obtain an LLR sequence according to an LLR value of a bit position of puncturing/shortening, where the LLR sequence includes g groups that are of equal length, a quantity of each group is N/g, N is a length of mother code of a polar code, N is an integral power of 2, g is an integer greater than or equal to 4 and less than N, and g is an integral power of 2.

According to a sixth aspect, embodiments of this application provide an apparatus for rate de-matching, including:
a memory, configured to store a program; and
a processor, configured to execute the program stored in the memory, where when the program is executed, the processor is configured to perform the method for rate de-matching in the fourth aspect and all possible implementations of the rate de-matching method.

With reference to any one of the first to the sixth aspects, in a possible implementation, the determining, based on the groups, a bit position of a bit that needs to be punctured/shortened in the first encoded bit sequence includes:
determining, based on the groups and a puncturing pattern or shortening pattern, the bit position of the bit that needs to be punctured/shortened in the first encoded bit sequence, puncturing/shortening a priority order of puncturing/shortening the g groups is determined according to the puncturing/shortening pattern.

In a possible implementation, a reverse relationship exists between the puncturing pattern and the shortening pattern.

In another possible implementation, the puncturing/shortening pattern includes: successively determining, based on the respectively priority order of puncturing/shortening, bit positions of bits that need to be punctured/shortened in all the groups.

In another possible implementation, the puncturing/shortening pattern includes: successively determining, based on a priority order of the groups, bits that need to be punctured/shortened from bits in groups with different priorities, and successively determining, in an alternate manner, bits in different groups with a same priority as bit positions of bits that need to be punctured/shortened.

In another possible implementation, the puncturing/shortening pattern is indicated by a sequence S, elements in the sequence S include group numbers of the g groups that are ordered based on the priority order of puncturing/shortening the g groups, and bit positions of first g/2 groups in the sequence S are symmetrical to bit positions of last g/2 groups in the sequence S.

In another possible implementation, the puncturing/shortening pattern is indicated by a sequence S, and elements in the sequence S include group numbers of the g groups that are sorted based on the priority order of puncturing/shortening the g groups, where
the sequence S is a sequence based on a natural order, a bit-reversal order, a reliability order, or a code weight order of polarized channels when the mother code length is g.

In another possible implementation, the puncturing/shortening pattern is indicated by a sequence S, the puncturing pattern includes: successively puncturing the groups in a first order based on the sequence S; and the shortening pattern includes: successively shortening the groups in a second order based on the sequence S, where the first order is from beginning of the sequence S to the end of the sequence S or from the end of the sequence S to beginning of the sequence S, and the first order and the second order are mutually reverse.

In another possible implementation, the puncturing/shortening pattern is indicated by a sequence S, and elements in the sequence S include group numbers of the g groups that are sorted based on the priority order of puncturing/shortening;
If g=4, S=[0, 1, 2, 3]; or
if g=8, S=[0, 1, 2, 4, 3, 5, 6, 7]; or
if g=16, S=[0, 1, 2, 4, 8, 3, 5, 9, 6, 10, 12, 7, 11, 13, 14, 15]; or
if g=32,
S=[0, 1, 2, 3, 4, 8, 16, 5, 6, 7, 9, 17, 10, 18, 11, 19, 12, 20, 13, 21, 14, 22, 24, 25, 26, 15, 23, 27, 28, 29, 30, 1]; or
if g=32,
S=[0, 1, 2, 3, 4, 8, 16, 5, 6, 7, 9, 17, 10, 18, 12, 20, 11, 19, 13, 21, 14, 22, 4, 25, 26, 15, 23, 27, 28, 29, 30, 31]; or
if g=64,
S=[0, 1, 2, 3, 4, 5, 6, 7, 8, 9, 10, 16, 32, 17, 33, 12, 18, 34, 20, 36, 11, 13, 14, 15, 19, 35, 21, 37, 22, 38, 23, 39, 24, 40, 25, 41, 26, 42, 28, 44, 48, 49, 50, 52, 27, 43, 29, 45, 51, 30, 46, 31, 47, 53, 54, 55, 56, 57, 58, 59, 60, 61, 62, 63].

A bit position of a bit that needs to be punctured is determined in ascending order of a natural order of the elements of the sequence S. The shortening pattern includes: determining, in descending order of a natural order of the elements of the sequence S, a bit position of a bit that needs to be shortened.

In another possible implementation, if g=4, the puncturing pattern is as follows: a group 0 is first punctured, and then a first group and a second group are alternately punctured; and the shortening pattern is as follows: a third group is first shortened, and then a second group and a first group are alternately shortened; or if g=8, the puncturing pattern is as follows: a zeroth group is first sequentially punctured and a first group, a second group and a fourth group are alternately punctured, and then a sixth group and a seventh group are alternately punctured; and the shortening pattern is as follows: a seventh group and a sixth group are first shortened, and then a fifth group and a third group are alternately shortened; or if g=16, the puncturing pattern is as follows: zeroth to second groups are first sequentially punctured, a fourth group and an eighth group are alternately punctured, a third group is punctured, and then a fifth group and a ninth group are alternately punctured; and the shortening pattern is as follows: a $15^{th}$ group, a $14^{th}$ group; and a $13^{th}$ group are first sequentially shortened, an $11^{th}$ group and a seventh group are alternately shortened, a $12^{th}$ group is shortened, and then a $10^{th}$ group and a sixth group are alternately shortened; or if g=32, the puncturing pattern is as follows: zeroth to fourth groups are first sequentially punctured, an eighth group and a $16^{th}$ group are alternately punctured, a fifth group, a sixth group, and a seventh group are sequentially punctured, a ninth group and a $17^{th}$ group are alternately punctured, a $10^{th}$ group and an $18^{th}$ group are alternately punctured, and then an $11^{th}$ group and a $19^{th}$ group are alternately punctured; and correspondingly, the shortening pattern is as follows: a $31^{st}$ group, a $30^{th}$ group, a $29^{th}$ group, a $28^{th}$ group, and a $27^{th}$ group are first sequentially shortened, a $23^{rd}$ group and a $15^{th}$ group are alternately shortened; a $26^{th}$ group, a $25^{th}$ group, and a $24^{th}$ group are sequentially shortened, a $22^{nd}$ group and a $14^{th}$ group are alternately shortened, a $21^{st}$ group and a $13^{th}$ group are alternately shortened, and then a $20^{th}$ group and a $12^{th}$ group are alternately shortened; or if g=32, the puncturing pattern is as follows: zeroth to fourth groups are first sequentially punctured, an eighth group and a $16^{th}$ group are alternately punctured, a fifth group, a sixth group, and a seventh group are sequentially punctured, a ninth group and a $17^{th}$ group are alternately punctured, a $10^{th}$ group and an $18^{th}$ group are alternately punctured, and then a $12^{th}$ group and a $20^{th}$ group are alternately punctured; and correspondingly, the shortening pattern is as follows: a $31^{st}$ group, a $30^{th}$ group, a $29^{th}$ group, a $28^{th}$ group, and a $27^{th}$ group are first sequentially shortened, a $23^{rd}$ group and a $15^{th}$ group are alternately shortened, a 26th group, a 25th group, and a $24^{th}$ group are sequentially shortened, a $22^{nd}$ group and a $14^{th}$ group are alternately shortened, a $21^{st}$ group and a $13^{th}$ group are alternately shortened, and then a $19^{th}$ group and an $11^{th}$ group are alternately shortened; or if g=64, the puncturing pattern is as follows: first sequentially puncturing zeroth to $10^{th}$ groups are first sequentially punctured, a $16^{th}$ group and a $32^{nd}$ group are alternately punctured, a $17^{th}$ group and a $33^{rd}$ group are alternately punctured, a $12^{th}$ group is punctured, a $18^{th}$ group and a $34^{th}$ group are alternately punctured, a $20^{th}$ group and a $36^{th}$ group are alternately punctured, an $11^{th}$ group, a $13^{th}$ group, a $14^{th}$ group, and a $15^{th}$ group are sequentially punctured, a $19^{th}$ group and a $35^{th}$ group are alternately punctured, a $21^{st}$ group and a $37^{th}$ group are alternately punctured, a $22^{nd}$ group and a $38^{th}$ group are alternately punctured, and then a $23^{rd}$ group and a $39^{th}$ group are alternately punctured; and the shortening pattern is as follows: a $63^{rd}$ group, a $62^{nd}$ group, a $61^{st}$ group, a $60^{th}$ group, a $59^{th}$ group, a $58^{th}$ group, a $57^{th}$ group, a $56^{th}$ group, a $55^{th}$ group, a $54^{th}$ group, and a $53^{rd}$ group are first sequentially shortened, a $47^{th}$ group and a $31^{st}$ group are alternately shortened, a $46^{th}$ group and a $30^{th}$ group are alternately shortened, a $51^{st}$ group is shortened, a $45^{th}$ group and a $29^{th}$ group are alternately shortened, a $43^{rd}$ group and a $27^{th}$ group are alternately shortened, a $52^{nd}$ group, a $50^{th}$ group, a $49^{th}$ group, and a $48^{th}$ group are sequentially shortened, a $44^{th}$ group and a $28^{th}$ group are alternately shortened, a $42^{nd}$ group and a $26^{th}$ group are alternately shortened, a $41^{st}$ group and a $25^{th}$ group are alternately shortened, and then a $40^{th}$ group and a $24^{th}$ group are alternately shortened.

In another possible implementation, the puncturing/shortening pattern is indicated by a sequence S, and elements in the sequence S include group numbers of the g groups that are sorted based on the priority order of puncturing/shortening the g groups.

If g=4, S=[0, (1, 2), 3]; or if g=8, S=[0, 1, (2, 4), (3, 5), 6, 7]; or if g=16, S=[0, 1, 2, (4, 8), 3, (5, 9), (6, 10), 12, (7, 11), 13, 14, 15]; or if g=32,

S=[0, 1, 2, 3, 4, (8, 16), 5, 6, 7, (9, 17), (10, 18), (11, 19), (12, 20), (13, 21), (14, 22), 24, 25, 26, (15, 23), 27, 28, 29, 30, 31]; or if g=32,

S=[0, 1, 2, 3, 4, (8, 16), 5, 6, 7, (9, 17), (10, 18), (12, 20), (11, 19), (13, 21), (14, 22), 24, 25, 26, (15, 23), 27, 28, 29, 30, 31]; or if g=64,

S=[0, 1, 2, 3, 4, 5, 6, 7, 8, 9, 10, (16, 32), (17, 33), 12, (18, 34), (20, 36), 11, 13, 14, 15, (19, 35), (21, 37), (22, 38), (23, 39), (24, 40), (25, 41), (26, 42), (28, 44), 48, 49, 50, 52, (27, 43), (29, 45), 51, (30, 46), (31, 47), 53, 54, 55, 56, 57, 58, 59, 60, 61, 62, 63]. Herein, ( ) used to indicate two groups with a same priority, and coded bits in the two groups are alternately punctured/shortened.

With reference to any one of the first to the sixth aspects, in a possible implementation, g is 4, 8, 16, 32, 64, 128, 256, 512, or 1024.

With reference to any one of the first to the sixth aspects, in a possible implementation, a group quantity g is determined by the length of mother code.

In a possible implementation, N/g is a fixed value; or when N is less than or equal to a preset value N0, g=g1; or when N is greater than N0, g=g2, where g1 and g2 are different values, and g1 and g2 each are one of 4, 8, 16, 32, 64, 128, 256, 512, or 1024.

With reference to any one of the first to the sixth aspects, in a possible implementation, an order of puncturing/shortening inter-group coded bits is a natural order, a bit-reversal order, a reliability order, or a code weight order.

With reference to any one of the first to the sixth aspects, in a possible implementation, rate matching is implemented by using a block interleaver: successively placing N coded bits into the block interleaver by column, where each column corresponds to one group; permuting columns of the block interleaver based on the determined inter-group puncturing/shortening priority order, and permuting rows of the block interleaver based on an inner-group puncturing/shortening order; and when rate matching manner is a puncturing, sequentially reading M coded bits from a first start point of the block interleaver; or sequentially reading coded bits simultaneously from a first start point and a second start point of the block interleaver until M bits are obtained after combination; or when rate matching manner is a shortening, sequentially reading M coded bits from a third start point of the block interleaver; or sequentially reading coded bits simultaneously read from a third start, point and a fourth start point of the block interleaver until M bits are obtained after combination, where N is a mother code length of a polar code, M is a target code length, the first start point corresponds to a bit at a bit position other than a punctured bit position, and the third start point corresponds to a bit at a bit position other than a shortened bit position.

In a possible implementation, the first start point is a lower right corner of the block interleaver, the second start point is an endpoint other than the first point on two ends of to-be-transmitted bits, the third start point is an upper left corner of the block interleaver, and the fourth start point is an endpoint other than the third point on two ends of to-be-transmitted bits.

In a possible implementation, when rate matching manner is puncturing, the M coded bits are sequentially read from the first start point of the block interleaver.

With reference to any one of the first to the sixth aspects, in a possible implementation, when an actual code rate is greater than a preset threshold, rate matching manner is determined to use the shortening; or when an actual code rate is less than or equal to a preset threshold, rate matching manner is determined to use the puncturing, where the actual code rate is K/M, K is a length of information bits, and M is a length of target code.

In a possible implementation, a value range of the preset threshold is a value within an interval [2/5, 1/2].

In a possible implementation, the preset threshold is 2/5, 4/9, or 1/2.

According to a seventh aspect, embodiments of this application provide a communications apparatus, including a bus, a processor, a storage medium, a bus interface, a network adapter, a user interface, and an antenna.

The bus is configured to connect the processor, the storage medium, the bus interface, and the user interface.

The processor is configured to perform the rate matching method in the first aspect or any implementation of the first aspect, or configured to perform the rate de-matching method in the fourth aspect or any implementation of the fourth aspect.

The storage medium is configured to store an operating system, and to-be-sent data or received data.

The bus interface is connected to the network adapter.

The network adapter is configured to implement a signal processing function of a physical layer in a wireless communications network.

The user interface is configured to connect to a user input device.

The antenna is configured to send and receive a signal.

Another aspect of this application provides a computer readable storage medium. The computer readable storage medium stores an instruction. When the instruction runs on a computer, the computer performs the method in any one of the foregoing aspects or implementations.

Another aspect of this application provides a computer program product including an instruction. When the instruction runs on a computer, the computer performs the method in any one of the foregoing aspects or implementations.

Another aspect of this application provides a computer program. When the computer program runs on a computer, the computer performs the method in any one of the foregoing aspects or implementations.

In the embodiments of this application, the coded bits are divided into g groups, and group-based puncturing/shortening rate matching is easy to implement, thereby improving polar code performance.

DESCRIPTION OF EMBODIMENTS

The following specific embodiments of this application with reference to accompanying drawings.

Figure 1:
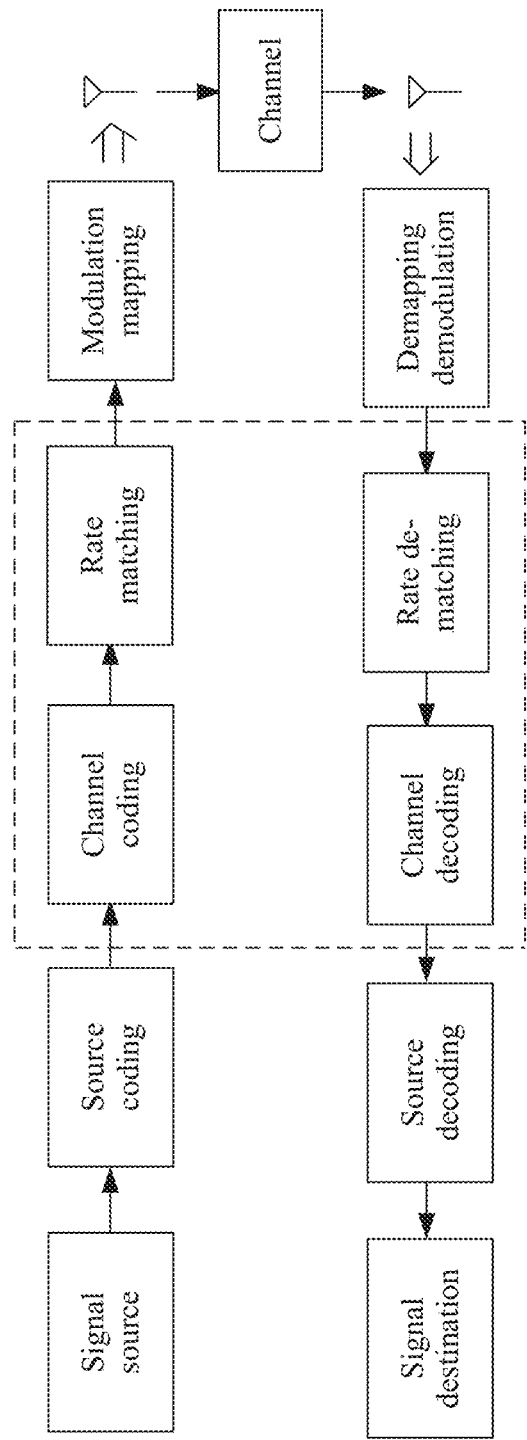
FIG. 1 is a schematic diagram of a basic wireless communication.

FIG. 1 shows a basic procedure of wireless communication. Assuming that communication signals are transmitted from a transmitting device (referred to as transmitting end hereinafter) to a receiving device (referred as receiving end hereinafter). At the transmitting end, a signal from a signal source is source encoded, channel encoded, rate matched, modulation mapped, and then transmitted to the receiving end. At the receiving end, after de-mapping demodulation, rate de-matching, channel decoding, and source decoding, the signal is output to a signal destination. In channel encoding and channel decoding, the polar coding process as described above can be used. Because a code length of an original polar code (mother code) is an integral power of 2, in practical applications, the code length may need to be adjusted to a different code length. This can be achieved through rate matching. At the transmitting end, the rate matching is performed after the channel encoding, to achieve any target code length. At, the receiving end, a rate de-matching is performed before channel decoding, to restore the polar code to its original length.

Figure 2:
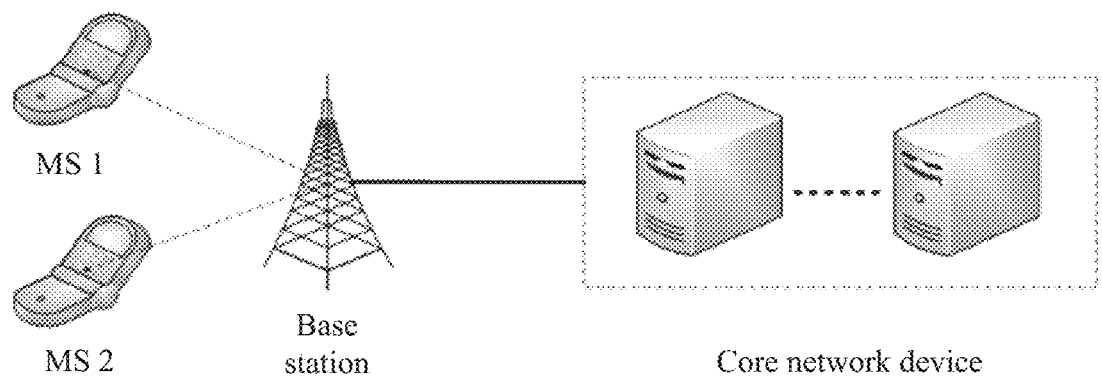
FIG. 2 is a schematic diagram of an application scenario of the data transmission method according to an embodiment of this application.

The embodiments of this application may be applied to a wireless communications system. The wireless communications system usually includes multiple cells. Each cell includes at least one base station (BS). The base station provides a communications service for a plurality of mobile stations MSs). The base station is connected to core network equipment, as shown in FIG. 2. The base station includes a baseband unit (BBU) and a remote radio unit (RRU). The BBU and the RRU may be placed at different places. For example, the RRU is remote and placed in a heavy-traffic area, and the BBU is placed in a central equipment room. The BBU and the RRU may be alternatively placed in a same equipment room. The BBU and the RRU may alternatively be different components of one rack.

Examples of wireless communications systems or schemes, in which the embodiments of this application may be applied, include but is not limited to: a Narrowband Internet of Things (IB-IoT) system, a Global System for Mobile Communications (GSM), an Enhanced Data Rates for GSM Evolution (EDGE) system, a Wideband Code Division Multiple Access (WCDMA) system, a Code Division Multiple Access 2000 (CDMA2000) system, a Time Division-Synchronous Code Division Multiple Access (TD-SCDMA) system, a Long Term Evolution (LTE) system, and three main application scenarios of the next-generation (5G) mobile communications system: enhanced mobile broadband (eMBB), ultra-Reliable and low-latency communication (URLLC), and enhanced Machine Type Communication (eMTC).

In the embodiments of this application, the base station is an apparatus that is deployed in a radio access network and that provides a wireless communications function for the MS. The base station may include a macro base station, a micro base station (also referred to as a small cell), a relay station, an access point, and the like. In systems using different radio access technologies, a device having a base station function may have different names. For example, the device may be referred to as an evolved NodeB, eNB or eNodeB) in the LTE system, a NodeB (in a 3rd Generation (3G) system, or the like. For ease of description, in all the embodiments of this application, all the foregoing apparatuses that provide the wireless communications function for the MS are collectively referred to as a network device, a base station, or a BS.

The MS in the embodiments of this application may include various handheld devices, in-vehicle devices, wearable devices, or a computing devices that have a wireless communications function, or other processing devices connected to a wireless modem. The MS may also be referred to as a terminal and may further include a subscriber unit, a cellular phone, a smartphone, a wireless data card, a personal digital assistant (PDA) computer, a tablet computer, a wireless modem, a handheld device, a laptop computer, a machine type communication (MTC) terminal, and the like. For ease of description, in all the embodiments of this application, the foregoing mentioned devices are collectively referred to as the MS.

A rate matching apparatus in the embodiments of this application may be the BS or the MS mentioned above, an apparatus disposed in the BS or the MS, or an apparatus disposed in another wireless communications device.

Quasi-uniform puncturing (QUP) is one of coding and rate matching methods for implementing a polar code with any code length. A length of mother code is first determined to be greater than or equal to an integral power of 2. Then a puncturing pattern (bit position of puncturing) is determined based on the length of mother code and the length of target code. The puncturing pattern may be represented by using a binary sequence. "0" indicates the bit position of puncturing, and "1" indicates a bit position of non-puncturing. A channel capacity corresponding to the bit position of puncturing is set to 0 (or an error probability is set to 1, or a signal-to-noise ratio SNR is set to be infinitely small). Reliability of a polarized channel is calculated and sorted by using a density evolution method, a Gaussian approximation method, or a linear fitting method. A bit position of an information bit (including a check bit and an assistant bit) and a bit position of a frozen bit are determined. At receiving end, a bit need to be punctured after encoding to obtain the polar encoded bit sequence after puncturing.

Figure 3:
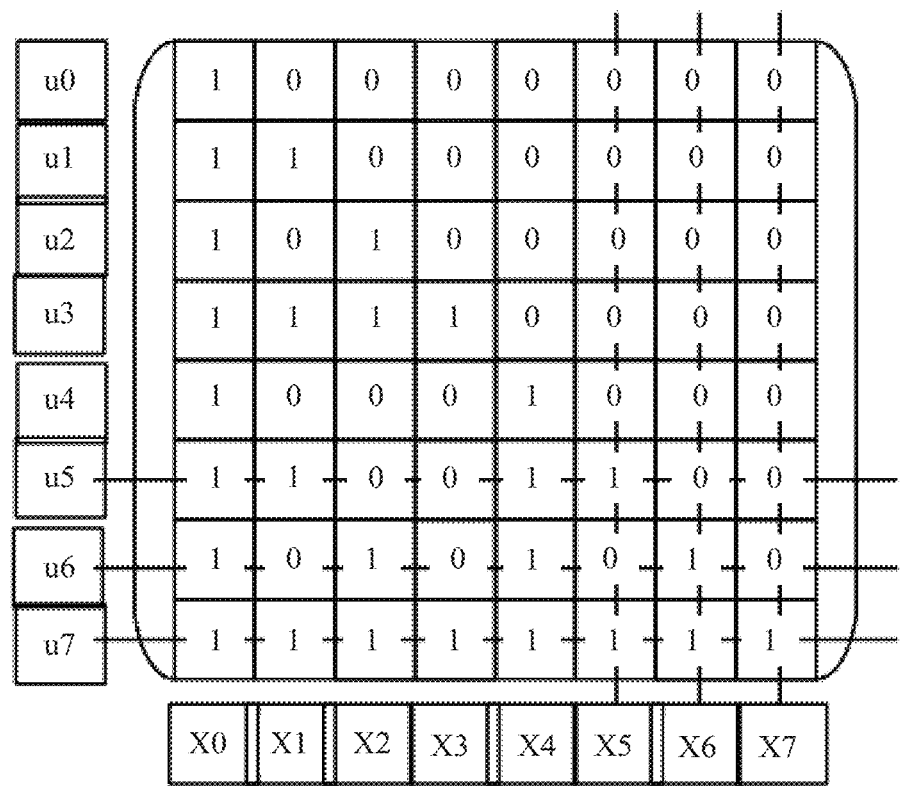
FIG. 3 is a construction diagram of an Arikan polar code.

Another method for polar code encoding and rate matching is shortening (or Shorten) a polar code. An encoded bit at a to-be-shortened location is related only to a frozen bit. Reliability of a polarized channel is first calculated based on a mother code. Then one or more bit positions of shortening is determined. One or more frozen bits are placed on a corresponding polarized channels. Then one or more bit positions for information bits (including a check bit and an assistant bit) and one or more bit positions of frozen bits are determined from remaining polarized channels based on the reliability. A bit placed at the bit position for shortening after coding is deleted to obtain the polar code, thereby implementing rate matching. In the shortening-based coding and rate matching scheme, the reliability of the polarized channel does not need to be recalculated (does not need to be reconstructed) based on the bit position for shortening, and the frozen bit is placed on the polarized channel corresponding to the to-be-shortened bit position, thereby greatly reducing polar code construction complexity. As shown in FIG. 3, a coding matrix $G_N$ is a lower triangular matrix, last (N−M) bits (N is a mother code length, and M is a target code length) may be deleted, and frozen bits are placed on last (N−M) polarized channels. In this case, a to-be-punctured bit is related only to the frozen bit. This may be used as a feasible shortening pattern.

Figure 4:
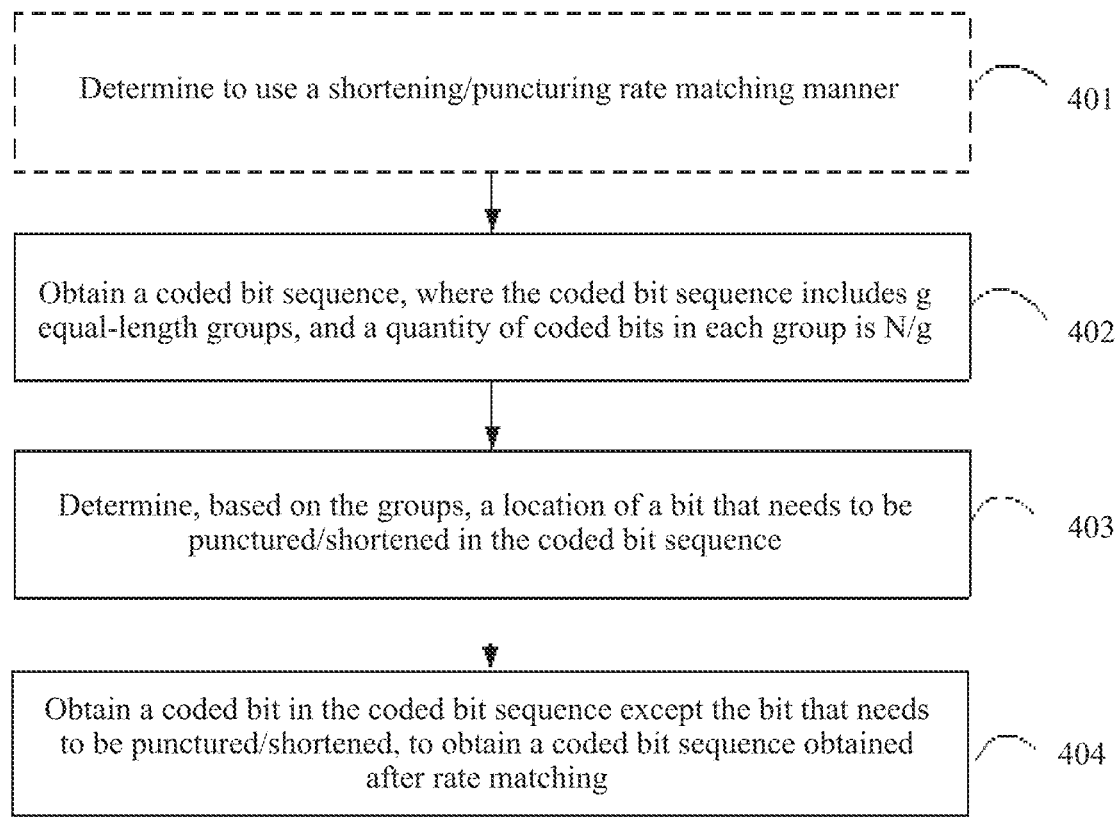
FIG. 4 is a schematic flowchart of a polar code rate matching method according to an embodiment of this application.

This application provides a polar code rate matching method. The method is group-based puncturing/shortening. As shown in FIG. 4, the rate matching method includes the following steps.

402. Obtain a first encoded bit sequence, where the first encoded bit sequence includes g groups that are of equal length, a quantity of first encoded bits in each group is N/g, N is a length of mother code, N is an integral power of 2, g is an integer greater than or equal to 4 and less than N, and g is an integral power of 2.

If g=4, the first encoded bits of the polar code are sequentially divided into four groups that are of equal length, and a quantity of encoded bits in each group is N/4. For example, if the length of mother code N is 64, and the first encoded bits are divided into four groups, the quantity of the first encoded bits in each group is 16; or if the length of mother code N is 256, and the first encoded bits are divided into four groups, the quantity of the first encoded bits in each group is 64. It can be learned that a larger value of N indicates a larger quantity of the first encoded bits in each group. A group granularity is relatively large when the first encoded bits are divided into four groups. Therefore, to further improve performance, a grouping manner with a relatively small granularity may be used. For example, g is 8, 16, 32, 64, 128, 256, 512, 1024, or the like, and g is an integral power of 2. Certainly, g needs to be less than N, so that grouping is meaningful.

A quantity of groups may be fixed, for example, 32. In this way, rate matching for any code length may be implemented by using a fixed block interleaver, a specific operation of the interleaver is determined by a sequence S whose length is 32. In another design, it is ensured that a quantity of bits in each group is fixed, for example, 16. However, a quantity of groups increases with the mother code length. In other words, the quantity of groups is N/16. The quantity of groups may also vary with the mother code length. For example, a larger mother code length indicates a larger quantity of groups. In this way, a smaller granularity is designed for rate matching and a more flexible design may indicate better performance. For example, a threshold N0 may be set. When N is less than or equal to the preset value N0, g=g1; and when N is greater than N0, g=g2, where g1 and g2 are different values, and g1 and g2 each are one of 4, 8, 16, 32, 64, 128, 256, 512, or 1024. For example, N0=256, g1=8, and g2=32. A relationship between N and g may also be prestored in a table, and a quantity of groups obtained though division is determined by searching the table.

403. Determine, based on the groups, a bit position of a bit that needs to be punctured/shortened in the first encoded bit sequence.

Specifically, the bit position of the bit that needs to be punctured/shortened in the first encoded bit sequence may be determined based on the groups and a puncturing/shortening pattern. The puncturing/shortening pattern determines a priority order of puncturing/shortening the g groups. A reverse relationship may exist between the puncturing pattern and the shortening pattern. Bit positions of bits that need to be punctured/shortened in all the groups may be successively determined based on the priority order of puncturing/shortening in all the groups. This pattern is briefly referred to as a sequential puncturing/shortening manner. A sequential and alternate puncturing/shortening manner may be alternatively used. To be specific, bit positions of bits that need to be punctured/shortened in a first quantity of groups are determined in the sequential puncturing/shortening manner based on a priority order, and an alternate puncturing/shortening manner is used for encoded bits in groups with a same priority in a second quantity of groups. In other words, bits in groups with different priorities are successively determined, based on a priority order of the groups, as bit positions of bits that need to be punctured/shortened, and bits in different groups with a same priority are successively determined, in the alternate manner, as bit positions of bits that need to be punctured/shortened.

404. Obtain a second encoded bit sequence in the first encoded bit sequence after removing the bit that needs to be punctured/shortened from the first encoded bit sequence, wherein the second encoded bit sequence is a bit sequence obtained after rate matching. In other words, a bit at a bit position specified by the puncturing/shortening pattern may be deleted, and a remaining encoded bit sequence is a bit sequence obtained after rate matching.

Optionally, the rate matching method may further include a polar coding process:

placing a frozen bit on a polarized channel corresponding to the bit position of the bit that needs to punctured/shortened; in remaining polarized channels, selecting a polarized channel with high reliability, placing an information bit (including a check bit and an assistant bit) on the polarized channel with high reliability, and placing frozen bits on the other polarized channels; and encoding a to-be-coded bit by channel coding, to obtain the first encoded bit sequence.

Optionally, the rate matching method may further include the following step:

401. Determine to use a shortening/puncturing rate matching manner.

Polar codes with different code lengths correspond to different QUP puncturing patterns. Polarized channel reliability needs to be recalculated (needs to be reconstructed) based on a coding parameter such as a code rate, and complexity is relatively high. For the shortening pattern, reliability of a later polarized channel in the polar code is relatively high, and placing a frozen bit on the polarized channel may result in performance instability. Particularly, when a code rate is low, this may cause an extremely large performance loss.

Specifically, a puncturing/shortening method may be determined based on an actual code rate. A value of the actual code rate is compared with a preset threshold, to determine to perform puncturing/shortening rate matching. If the actual code rate R=K/M>R0, shortening rate matching is performed. A coded bit at a to-be-shortened bit position is shortened (deleted), and a frozen bit is placed on a polarized channel whose sequence number is equal to that of the to-be-shortened bit position. During decoding, a log-likelihood ratio LLR of the shortened bit position is set to be infinitely large. If the actual code rate R≥R0, puncturing rate matching is performed. A coded bit at a to-be-punctured bit position is punctured (deleted), and a frozen bit is placed on a polarized channel whose sequence number is equal to that of the to-be-punctured bit position. During decoding, an LLR of the punctured bit position is set to 0. The value of the preset threshold R0 may be between 2/5 and 1/2, for example, the value of R0 is 2/5, 4/9, 1/2, or the like.

The puncturing pattern or the shortening pattern in this embodiment of this application indicates an order that is used to determine a group that is first punctured/shortened and a group that is punctured/shortened later during puncturing/shortening. A priority order specified in the puncturing pattern or the shortening pattern may be used to determine a bit position of a to-be-punctured or to-be-shortened coded bit. A reverse relationship may exist between the designed puncturing pattern and shortening pattern. For coding bits, puncturing is performed from the front beginning to the end, and shortening is performed from the end to the beginning.

The puncturing/shortening pattern may be indicated by using a sequence S, and group numbers of the g groups are ordered based on a priority order of puncturing/shortening the g groups. Elements of the sequence S include group numbers of the g groups sorted based on the priority order of puncturing/shortening the g groups. The indication sequence S may be a reliability sequence, a natural order sequence, a code weight order sequence of the polar code, or another sequence with excellent performance. The puncturing pattern includes: successively puncturing the groups in a first order based on the sequence S. The shortening pattern includes: successively shortening the groups in a second order based on the sequence S. The first order is from the beginning to the end or from the end to the beginning, and the first order and the second order are mutually reverse.

For example, g=32, and a sequence that is obtained after polarized channels of the polar code whose mother code length is 32 are sorted based on reliability may be used as an indication sequence. In an example, a sequence that is obtained after reliability calculated based on a polarization weight is sorted in ascending order is as follows:

S=[0, 1, 2, 4, 8, 16, 3, 5, 6, 9, 10, 17, 12, 18, 20, 24, 7, 11, 13, 19, 14, 21, 22, 25, 26, 28, 15, 23, 27, 29, 30, 31].

In another example, a sequence that is obtained after reliability calculated based on a Gaussian approximation (GA) or density evolution (DE) method is sorted in ascending order is as follows:

S=[0, 1, 2, 4, 8, 16, 3, 5, 6, 9, 10, 17, 12, 18, 20, 7, 24, 11, 13, 19, 14, 21, 22, 25, 26, 28, 15, 23, 27, 29, 30, 31].

In still another example, a quantity of 1s in a row of a coding matrix of the polar code is a code weight of the row. Sorting is performed in ascending order based on the code weight. A smaller sequence number in sequence numbers with a same code weight is placed at the front. Therefore, a sequence of sorting code weights is obtained. The sequence of sorting the code weights in ascending order is as follows:

S=[0, 1, 2, 4, 8, 16, 3, 5, 6, 9, 10, 12, 17, 18, 20, 24, 7, 11, 13, 14, 19, 21, 22, 25, 26, 28, 15, 23, 27, 29, 30, 31].

For an indication sequence when another value of g is used, a corresponding reliability sequence, a natural order sequence, a code weight order sequence of the polar code may be obtained with reference to the manner used when g=32. Puncturing is performed from the beginning to end based on the indication sequence S. To be specific, puncturing is performed from a group indicated by a first element of the sequence, and is further performed on a group indicated by a second element if a quantity of punctured bits is less than a quantity of bits that need to be punctured. Sequential puncturing is performed until the quantity of bits that need to be punctured are punctured. Shortening is performed from back to front. To be specific, shortening is performed from a group indicated by a last element of the sequence S, and is further performed on a group indicated by a penultimate element if a quantity of shortened bits is less than a quantity of bits that need to be shortened. Sequential shortening is performed until the quantity of bits that need to be shortened are shortened. In the puncturing/shortening process, if a quantity of remaining bits that need to be punctured/shortened is less than a total quantity of bits in one group, for an inner-group puncturing/shortening order, refer to an inter-group puncturing/shortening order. In other words, the inner-group puncturing/shortening order may be a reliability sequence, a natural order sequence, a code weight order sequence of the polar code, or another sequence with excellent performance. It is assumed that the mother code length N=256, and g"32. A quantity of bits in each group is 256/32=8. The 8 bits in each group may be sorted based on a reliability sequence used when N=8, in a natural order, or based on a code weight order used when N=8. For the puncturing/shortening order, refer to the inter-group puncturing/shortening order described above.

There may be two group-based puncturing/shortening manners. One manner is natural-order puncturing/shortening. Bit positions of bits that need to be punctured/shortened in all groups obtained through division are successively determined based on a priority order that is of puncturing/shortening all the groups and that is determined based on a puncturing/shortening pattern. Another manner is natural-order and alternate puncturing/shortening. A puncturing/shortening pattern includes: successively determining, based on a group priority order, bits in a first quantity of groups as bit positions of bits that need to be punctured/shortened, and successively determining, in an alternate manner, bits in different groups with a same priority in a second quantity of groups as bit positions of bits that need to be punctured/shortened. The following describes the two manners with reference to a coding and rate matching process.

(1) Sequential Puncturing/Shortening Encoding and Rate Matching Scheme.

Encoded bits of a polar code are sequentially divided into several groups that are of equal length. Puncturing/shortening is performed in a unit of group (based on groups) based on a puncturing/shortening pattern indicated by a specific sequence S. A length of S is the same as a quantity of groups of S. All bits in a group specified by an element are punctured/shortened based on an element order of S. If a quantity of remaining bits that need to be punctured/shortened exceeds a quantity of bits in one group, all bits in a group specified by a next element are punctured/shortened; or if a quantity of remaining bits that need to be punctured/shortened is less than a quantity of bits in one group, a bit in the group is punctured/shortened based on another specific order. A determined to-be-punctured/shortened bit position indicates that the puncturing/shortening pattern is determined. A frozen bit is placed on a polarized channel corresponding to a sequence number of a to-be-punctured/shortened bit. In remaining polarized channels, a polarized channel with high reliability is selected, an information bit (including a check bit and an assistant bit) is placed on the polarized channel with high reliability, and frozen bits are placed on the other polarized channels. A to-be-coded bit is mapped to the information bit for channel coding, and a coded bit at a bit position specified by the puncturing/shortening pattern is deleted to obtain a coded bit obtained after rate matching. Whether to select a puncturing rate matching method or a shortening rate matching method may be determined based on a code rate. To be specific, the shortening rate matching method is selected when the code rate exceeds a preset threshold; or the puncturing rate matching method is selected when the code rate does not exceed a preset threshold.

(2) Coding and Rate Matching Scheme in Which Natural-Order Puncturing/shortening and Alternate Puncturing/Shortening Are Combined.

In this scheme, in groups indicated by all elements of an indication sequence, puncturing/shortening is successively performed in the natural order on some groups, and inter-group alternate puncturing/shortening is performed on some inter-group coded bits. To be specific, the puncturing pattern is set as follows: puncturing a first quantity of groups based on a priority order, and puncturing groups with a same priority in a second quantity of groups in an alternate order. Correspondingly, the shortening pattern is set as follows: shortening a first quantity of groups based on a priority order, and shortening groups with a same priority in a second quantity of groups in an alternate manner.

Figure 5:
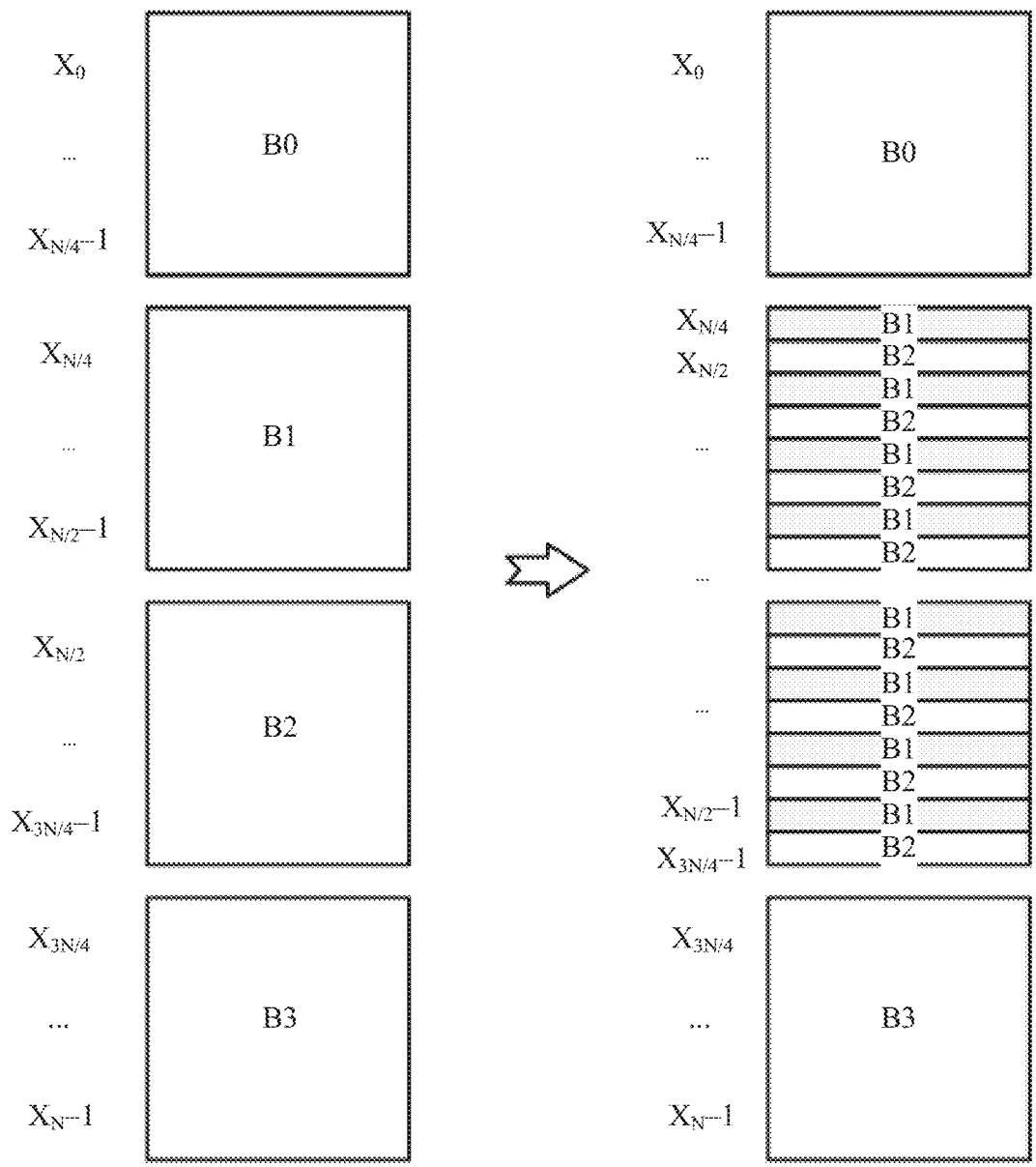
FIG. 5 is a schematic diagram of dividing coded bits of a polar code into four groups for puncturing according to an embodiment of this application.

For example, g=4. As shown in FIG. 5, the coded bits of the polar code are divided into four groups: B0, B1, B2, and B3 in the natural order. During puncturing, the first group B0 is first sequentially punctured in a front-to-back order. If a quantity of to-be-punctured bits exceeds a quantity of coded bits in one group, after all coded bits in the first group are punctured, the two middle segments B1 and B2 are alternately punctured in a front-to-back order until a required code length is reached. A to-be-shortened bit position is opposite to a to-be-punctured bit position. The last group B3 is first shortened, and then the two middle group are alternately shortened in a back-to-front order. When g=4, performance obtained in some area in which a puncturing order in the sequential and alternate scheme is used may be approximate to performance obtained through reconstruction. However, when a quantity of to-be-punctured bits is approximately ¼ mother code length, there is an obvious performance loss relative to performance obtained through puncturing based on reliability. If g is greater than 4, for example, g is 16, 32, 64, or larger, for a priority order of puncturing/shortening groups, refer to a sequential and alternate principle used when four groups are obtained through division. For example, first N/4 coded bits are sequentially punctured/shortened, middle N/2 coded bits are alternately punctured/shortened, and last N/4 bits are sequentially punctured/shortened. Certainly, a quantity of coded bits that need to be punctured/shortened usually does not exceed N/2 because if the quantity exceeds N/2, a smaller mother code length may be used during coding. Therefore, if puncturing is performed from front to back, and shortening is performed in a back-to-front order, the first N/4 coded bits are only punctured and are not shortened, the middle N/2 coded bits may be punctured/shortened, and the last N/4 coded bits are only shortened. In other words, if puncturing is performed from front to back, and shortening is performed in a back-to-front order, first g/4 groups are only punctured and are not shortened, middle g/2 groups may be punctured/shortened, and last g/4 groups are only shortened.

To further improve performance, the group granularity is changed, or the puncturing/shortening pattern (the sequence S) is optimized. In addition, to facilitate implementation and improve performance stability, a symmetrical sequence S may be used. To be specific, group positions in the sequence S are symmetrical based on a group sorting result. In other words, positions of first g/2 groups are symmetrical to positions of last g/2 groups in the sequence S. The following lists some symmetrical sequences S that may be applied to a sequential puncturing/shortening case. In the sequence, bold group numbers indicate first g/2 groups, and non-bold group numbers indicate last g″2 groups. A bold type is only for ease of description, and whether a sequence number is bold does not indicate a sequence difference.

If g=4, S=[0, 1, 2, 3].
 if g=8, S=[0, 1, 2, 4, 3, 5, 6, 7].
 if g=16, S=[0, 1, 2, 4, 8, 3, 5, 9, 6, 10, 12, 7, 11, 13, 14, 15].
 if g=32,
 S=[0, 1, 2, 3, 4, 8, 16, 5, 6, 7, 9, 17, 10, 18, 11, 19, 12, 20, 13, 21, 14, 22, 24, 25, 26, 15, 23, 27, 28, 29, 30, 1].
 if g=32, the sequence S may be further adjusted to:
 S=[0, 1, 2, 3, 4, 8, 16, 5, 6, 7, 9, 17, 10, 18, 12, 20, 11, 19, 13, 21, 14, 22, 4, 25, 26, 15, 23, 27, 28, 29, 30, 31].
 if g=64,
 S=[0, 1, 2, 3, 4, 5, 6, 7, 8, 9, 10, 16, 32, 17, 33, 12, 18, 34, 20, 36, 11, 13, 14, 15, 19, 35, 21, 37, 22, 38, 23, 39, 24, 40, 25, 41, 26, 42, 28, 44, 48, 49, 50, 52, 27, 43, 29, 45, 51, 30, 46, 31, 47, 53, 54, 55, 56, 57, 58, 59, 60, 61, 62, 63].

A bit position of a bit that needs to be punctured is determined in ascending order of a natural order of elements of the sequence S. A shortening pattern includes: determining, in descending order of a natural order of elements of the sequence S, a bit position of a bit that needs to be shortened.

If the symmetrical sequence S is sequentially and alternately punctured/shortened, a group order is unchanged. However, during alternate puncturing/shortening, an alternately group need to be punctured/shortened may be identified by using brackets, to indicate that different groups indicated in the brackets have a same priority, and bits in different groups are alternately punctured/shortened. Therefore, the symmetrical sequence S may be represented as follows:

If g=4, S=[0, (1, 2), 3]; or a puncturing/shortening pattern is represented as follows: for the puncturing pattern, first puncturing a zeroth group, and then alternately puncturing a first group and a second group; and for the shortening pattern, first shortening a third group, and then alternately shortening a second group and a first group.

If g=8, S=[0, 1, (2, 4), (3, 5), 6, 7]; or a puncturing/shortening pattern is represented as follows: for the puncturing pattern, sequentially puncturing a zeroth group and a first group, and then alternately puncturing a second group and a fourth group; and for the shortening pattern, first shortening a seventh group and a sixth group, and then alternately shortening a fifth group and a third group.

If g=16,
 S=[0, 1, 2, (4, 8), 3, (5, 9), (6, 10), 12, (7, 11), 13, 14, 15];
 or a puncturing/shortening pattern is represented as follows: for the puncturing pattern, first sequentially puncturing zeroth to second groups, alternately puncturing a fourth group and an eighth group, puncturing a third group, and then alternately puncturing a fifth group and a ninth group; and for the shortening pattern, sequentially shortening a $15^{th}$ group, a $14^{th}$ group; and a $13^{th}$ group alternately shortening an $11^{th}$ group and a seventh group, shortening a $12^{th}$ group, and then alternately shortening a $10^{th}$ group and a sixth group.

If g=32,
 S=[0, 1, 2, 3, 4, (8, 16), 5, 6, 7, (9, 17), (10, 18), (11, 19), (12, 20), (13, 21), (14, 22), 24, 25, 26, (15, 23), 27, 28, 29, 30, 31].

For ease of expression, S may also be represented as follows:
 S=[0, 1, 2, 3, 4, (8, 16), 5, 6, 7, (9-11, 17-19), (12-14, 20-22), 24, 25, 26, (15, 23), 27, 28, 29, 30, 31]; or
 a puncturing/shortening pattern is represented as follows:
 for the puncturing pattern, first sequentially puncturing zeroth to fourth groups, alternately puncturing an eighth group and a $16^{th}$ group, sequentially puncturing a fifth group, a sixth group, and a seventh group, alternately puncturing a ninth group and a $17^{th}$ group, alternately puncturing a $10^{th}$ group and an $18^{th}$ group, and then alternately puncturing an $11^{th}$ group and a $19^{th}$ group; and for the shortening pattern, first sequentially shortening a $31^{st}$ group, a $30^{th}$ group, a $29^{th}$ group, a $28^{th}$ group, and a $27^{th}$ group, alternately shortening a $23^{rd}$ group and a $15^{th}$ group, sequentially shortening a $26^{th}$ group, a $25^{th}$ group, and a $24^{th}$ group, alternately shortening a $22^{nd}$ group and a $14^{th}$ group, alternately shortening a $21^{st}$ group and a $13^{th}$ group, and then alternately shortening a $20^{th}$ group and a $12^{th}$ group.

Alternatively, if g=32,

S=[0, 1, 2, 3, 4, (8, 16), 5, 6, 7, (9, 17), (10, 18), (12, 20), (11, 19), (13, 21), (14, 22), 24, 25, 26, (15, 23), 27, 28, 29, 30, 31]; or a puncturing/shortening pattern is represented as follows: for the puncturing pattern, first sequentially puncturing zeroth to fourth groups, alternately puncturing an eighth group and a $16^{th}$ group, sequentially puncturing a fifth group, a sixth group, and a seventh group, alternately puncturing a ninth group and a 17th group, alternately puncturing a $10^{th}$ group and an $18^{th}$ group, and then alternately puncturing a $12^{th}$ group and a $20^{th}$ group; and for the shortening pattern, first sequentially shortening a $31^{st}$ group, a $30^{th}$ group, a $29^{th}$ group, a $28^{th}$ group, and a $27^{th}$ group, alternately shortening a $23^{rd}$ group and a $15^{th}$ group, sequentially shortening a 26th group, a $25^{th}$ group, and a $24^{th}$ group, alternately shortening a $22^{nd}$ group and a $14^{th}$ group, alternately shortening a $21^{st}$ group and a $13^{th}$ group, and then alternately shortening a $19^{th}$ group and an $11^{th}$ group.

If g=64,

S=[0, 1, 2, 3, 4, 5, 6, 7, 8, 9, 10, (16, 32), (17, 33), 12, (18, 34), (20, 36), 11, 13, 14, 15, (19, 35), (21, 37), (22, 38), (23, 39), (24, 40), (25, 41), (26, 42), (28, 44), 48, 49, 50, 52, (27, 43), (29, 45), 51, (30, 46), (31, 47), 53, 54, 55, 56, 57, 58, 59, 60, 61, 62, 63]; or a puncturing and shortening pattern is represented as follows: for the puncturing pattern, first sequentially puncturing zeroth to $10^{th}$ groups, alternately puncturing a $16^{th}$ group and a $32^{nd}$ group, alternately puncturing a $17^{th}$ group and a $33^{rd}$ group, puncturing a $12^{th}$ group, alternately puncturing a $12^{th}$ group and a $34^{th}$ group, alternately puncturing a $20^{th}$ group and a $36^{th}$ group, sequentially puncturing an $11^{th}$ group, a $13^{th}$ group, a $14^{th}$ group, and a $15^{th}$ group, alternately puncturing a $19^{th}$ group and a $35^{th}$ group, alternately puncturing a $21^{st}$ group and a $37^{th}$ group, alternately puncturing a $22^{nd}$ group and a $38^{th}$ group, and then alternately puncturing a $23^{rd}$ group and a $39^{th}$ group; and for the shortening pattern, sequentially shortening a $63^{rd}$ group, a $62^{nd}$ group, a $61^{st}$ group; a $60^{th}$ group; a $59^{th}$ group, a $58^{th}$ group, a $57^{th}$ group, a $56^{th}$ group, a $55^{th}$ group, a $54^{th}$ group, and a $53^{rd}$ group, alternately shortening a $47^{th}$ group and a $31^{st}$ group, alternately shortening a $46^{th}$ group and a $30^{th}$ group, shortening a $51^{st}$ group, alternately shortening a $45^{th}$ group and a $29^{th}$ group, alternately shortening a $43^{rd}$ group and a $27^{th}$ group, sequentially shortening a $52^{nd}$ group, a $50^{th}$ group, a $49^{th}$ group, and a $48^{th}$ group, alternately shortening a $44^{th}$ group and a $28^{th}$ group, alternately shortening a $42^{th}$ group and a $26^{th}$ group, alternately shortening a $41^{st}$ group and a $25^{th}$ group, and then alternately shortening a $40^{th}$ group and a $24^{th}$ group.

In the foregoing sequences, two groups in brackets have a same priority, and are alternately punctured/shortened, and groups outside brackets are punctured/shortened based on a natural order of the sequence S. A priority order of determining to-be-punctured bit positions is a begin-to-end order of the sequence S, and a priority order of determining to-be-shortened bit positions is a begin-to-end order of the sequence S (wherein "begin-to-end order" is an order from the beginning of the bit sequence to end of the bit sequence).

The puncturing/shortening pattern described in this application indicates a priority order of puncturing/shortening all groups. This does not mean that all groups indicated by the puncturing/shortening pattern are punctured/shortened. Instead, a coded bit that needs to be punctured/shortened is determined based on the puncturing/shortening pattern and a quantity of coded bits that need to be punctured/shortened, until the quantity of coded bits that need to be punctured/shortened is determined. A remaining coded bit that is not determined as a coded bit that needs to be punctured/shortened is a coded bit obtained after rate matching, and is to be transmitted to a receive end.

With reference to a coding and rate matching process, the following describes application of the rate matching method provided in this application. For a polar code in which a mother code length is N, a target code length is M (when M<N, puncturing/shortening rate matching needs to be implemented; or if M≥N, repetition or segmentation rate matching may be implemented), and a length of information bits (including a check bit and a assistant bit) is K, a coding and rate matching process may include: selecting (N−M) coded bits from the mother code as to-be-punctured/shortened bits based on a puncturing/shortening pattern, placing a frozen bit on a polarized channel with a sequence number corresponding to the (N−M) coded bits need to be punctured/shortened; in remaining polarized channels after the coded bits to be punctured/shortened are selected, selecting a polarized channel with high reliability, placing an information bit (including a check bit and a assistant bit) on the polarized channel with high reliability, and placing frozen bits on the other channels; mapping the information bit (including a check bit and a assistant bit) to the information bit for channel coding; and puncturing a bit position specified by the puncturing/shortening pattern, to obtain a encoded bit obtained after rate matching. Whether to use a puncturing rate matching manner or a shortening rate matching manner and whether to use a puncturing pattern or a shortening pattern are determined in the foregoing described manners.

The following uses an example in which g=32, to describe a method for sequentially determining a to-be-punctured/shortened bit position. Whether to use a puncturing rate matching method or a shortening rate matching method is determined. Coded bits of a polar code are sequentially divided into 32 equal-length groups, and a quantity of coded bits in each group is N/32. A to-be-punctured/shortened bit position is determined in a unit of group based on a sequence S (whose length is 32). When a quantity of to-be-punctured/shortened bits is P, a quantity of groups that need to be completely deleted is numG=floor(P/(N/32)), and a quantity of to-be-punctured bits in a remaining group that does not need to be completely deleted is P−numG*N/32, where floor indicates rounding down. That the quantity of groups that need to be completely deleted is numG indicates that all groups specified by first numG elements of the sequence S are to be punctured/shortened. That the group does not need to be completely punctured/shortened indicates that remaining N−M−numG*N/32 to-be-punctured/shortened bits are selected from a group specified by a $(numG+1)^{th}$ element of the sequence S. An information bit is mapped to an information bit channel, and is coded based on a coding matrix $G_N=F_2^{\otimes(log_2(N))}$. A coded bit at the determined to-be-punctured/shortened bit position is deleted when a coded bit sequence obtained after rate matching is sent.

Assuming that g=32, a corresponding sequence is as follows:

S=[0, 1, 2, 3, 4, 8, 16, 5, 6, 7, 9, 17, 10, 18, 11, 19, 12, 20, 13, 21, 14, 22, 24, 25, 26, 15, 23, 27, 28, 29, 30, 31].

The sequence indicates a number of a to-be-punctured group from front to back. In other words, a puncturing priority is as follows: first puncturing a zeroth group, and then successively puncturing a first group, a second group, a third group, and on the like until a puncturing quantity reaches a required puncturing quantity. In other words, the zeroth group has a first priority to be punctured, the first group has a second priority, and a $19^{th}$ group has a $16^{th}$ priority.

Figure 6:
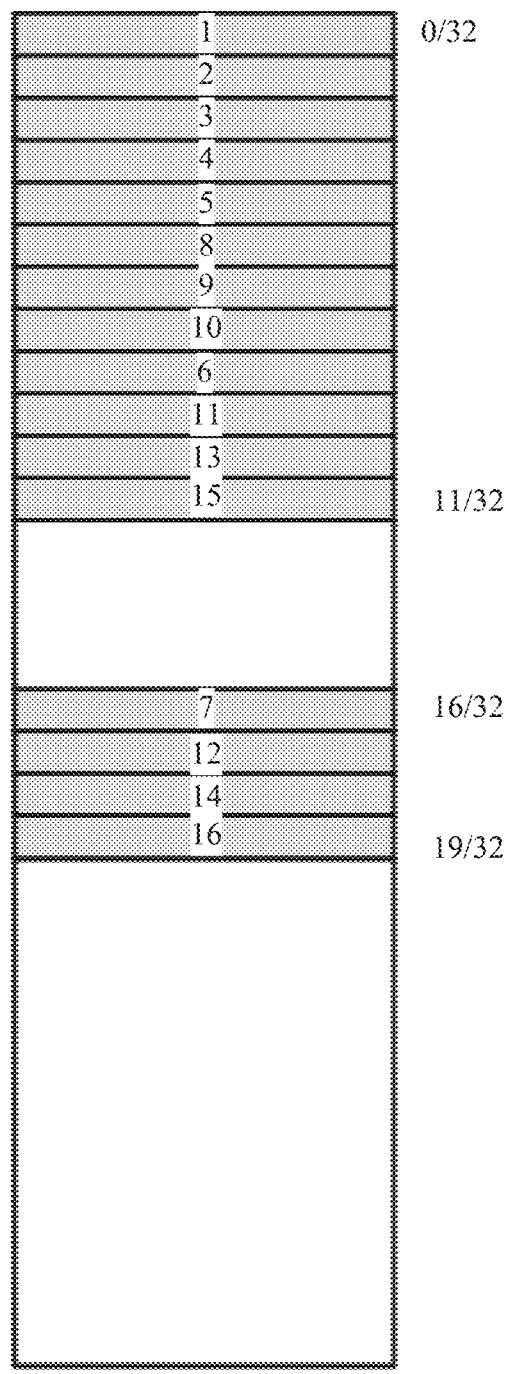
FIG. 6 is a schematic diagram of dividing coded bits of a polar code into 32 groups for sequential puncturing according to an embodiment of this application.

A puncturing order generated by the sequence is shown in FIG. 6. In the figure, a number at a right side is a group sequence number, and a gray block is a candidate to-be-punctured bit. A number in the gray block is a priority order of puncturing groups, and a smaller number indicates a higher puncturing priority.

Front and back locations of S are symmetrical, and a reversed S from the beginning to the end is a shortening indication sequence. For example, a group 0 indicated by a first element in the S is symmetrical to a group 31 indicated by a last element in the 5, and a group 1 indicated by a second element in the S is also symmetrical to a group 30 indicated by a penultimate element in the S. The sequence indicates a number of a to-be-shortened group from the end to the beginning. In other words, a shortening priority is as follows: first shortening a $31^{st}$ group, and then successively shortening a $30^{th}$ group, a $29^{th}$ group, and the like until a shortening quantity reaches a required shortening quantity. In other words, the $31^{st}$ group has a first priority to be shortened, the $30^{th}$ group has a second priority, and a $12^{th}$ group has a $16^{th}$ priority.

In a sequential puncturing/shortening scheme, rate matching may be implemented by using a block interleaver. N coded bits are successively placed into the block interleaver by column. Each column corresponds to one group, and there are g columns and N/g rows in total. Columns of the block interleaver are permuted based on a determined inter-group puncturing/shortening priority order, and rows of the block interleaver are permuted based on an inner-group puncturing/shortening order. If it is determined to use a puncturing rate matching manner, M coded bits are sequentially read from a first start point of the block interleaver; or coded bits are sequentially read simultaneously from a first start point and a second start point of the block interleaver until M bits are obtained after combination. If it is determined to use a shortening rate matching manner, M coded bits are sequentially read from a third start point of the block interleaver; or coded bits are sequentially read simultaneously from a third start point and a fourth start point of the block interleaver until M bits are obtained after combination. N is a mother code length of a polar code, M is a target code length, the first start point corresponds to a bit at a bit position except a punctured bit position, and the second start point corresponds to a bit at a bit position except a shortened bit position.

Figure 7:
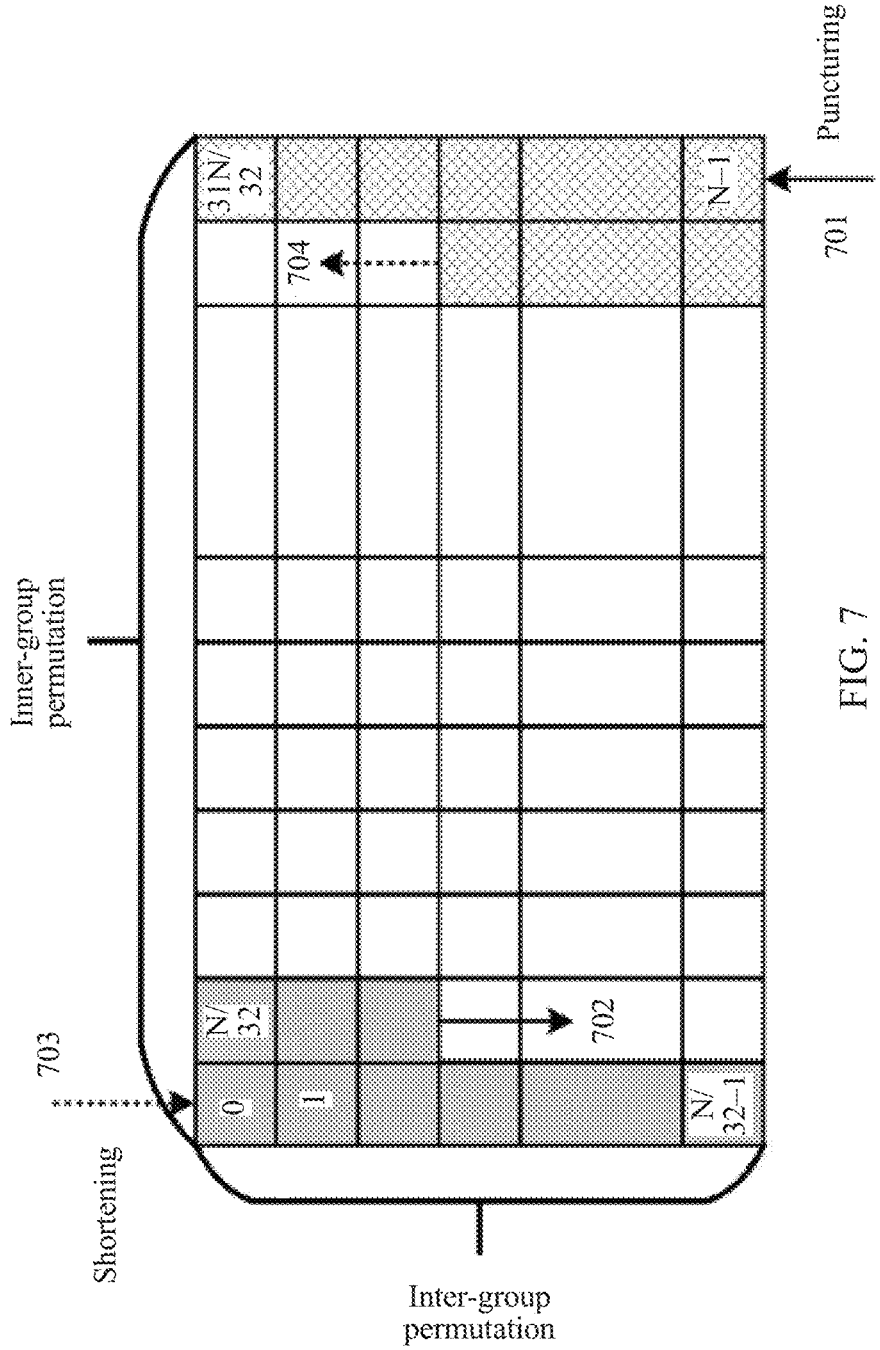
FIG. 7 is a schematic diagram of implementing sequential puncturing/shortening by using a block interleaver according to an embodiment of this application.

The following uses an example in which g=32, to describe a method for implementing rate matching by using the block interleaver. An implementation process of the block interleaver includes: writing N coded bits into the block interleaver by column, where the block interleaver includes 32 columns and N/32 rows in total; first performing column permutation based on a sequence S, in other words, groups are rearranged; then performing row permutation based on the inner-group puncturing/shortening order, in other words, rearranging an inner-group bit order; and gathering to-be-punctured/shortened bits on an end of the block interleaver after the column permutation and the row permutation. As shown in FIG. 7, if puncturing is to be performed, to-be-punctured (to-be-deleted) bits are gathered on a leftmost side (a grey area) of the block interleaver; if shortening is to be performed, to-be-deleted bits are gathered on a rightmost side (a grid area) of the block interleaver.

Because the to-be-deleted bits have been gathered together, interleaving may be differently implemented by adjusting an order of reading to-be-transmitted bits, to meet a requirement of higher order modulation and a fading channel. For example, the to-be-transmitted bits are directly sequentially read. During shortening, reading is started from an upper left corner of the block interleaver, in other words, reading is sequentially performed from a first element downwards by column until M coded bits are read. During puncturing, reading is started from a lower right corner of the block interleaver, in other words, reading is sequentially performed from a last element upwards by column until M coded bits are read. During repetition, reading may be performed in any order. To be specific, the block interleaver also provides a repetition pattern, namely, a coded bit selection order during repetition. Because bit positions of the to-be-transmitted bits may be conveniently obtained through calculation, alternatively, reading may be sequentially performed simultaneously from two ends of the to-be-transmitted bits, and read bit streams are finally directly connected. In FIG. 7, the first start point is a bit position indicated by 701 at a lower right corner, the second start point is a bit position indicated by 702, the third start point is a bit position indicated by 703 at an upper left corner, and the fourth start point is a bit position indicated by 704.

After a column is read, cyclic shift may be further performed on the column. A cyclic shift value of each column may be determined based on a function, for example, 5*i, or $f_1*i+f_2*i^2$, or $\lceil (f_1*i+f_2*i^2)/a \rceil$ where $\lceil \cdot \rceil$ indicates rounding up, i is a column number, and $f_1$, $f_2$, and a are constants. Cyclic shift of each column is ensured as much as possible to be random. In this way, a final read coded sequence is broken after interleaving, so that relatively good performance can be achieved in a case of the higher order modulation and the fading channel.

Figure 8:
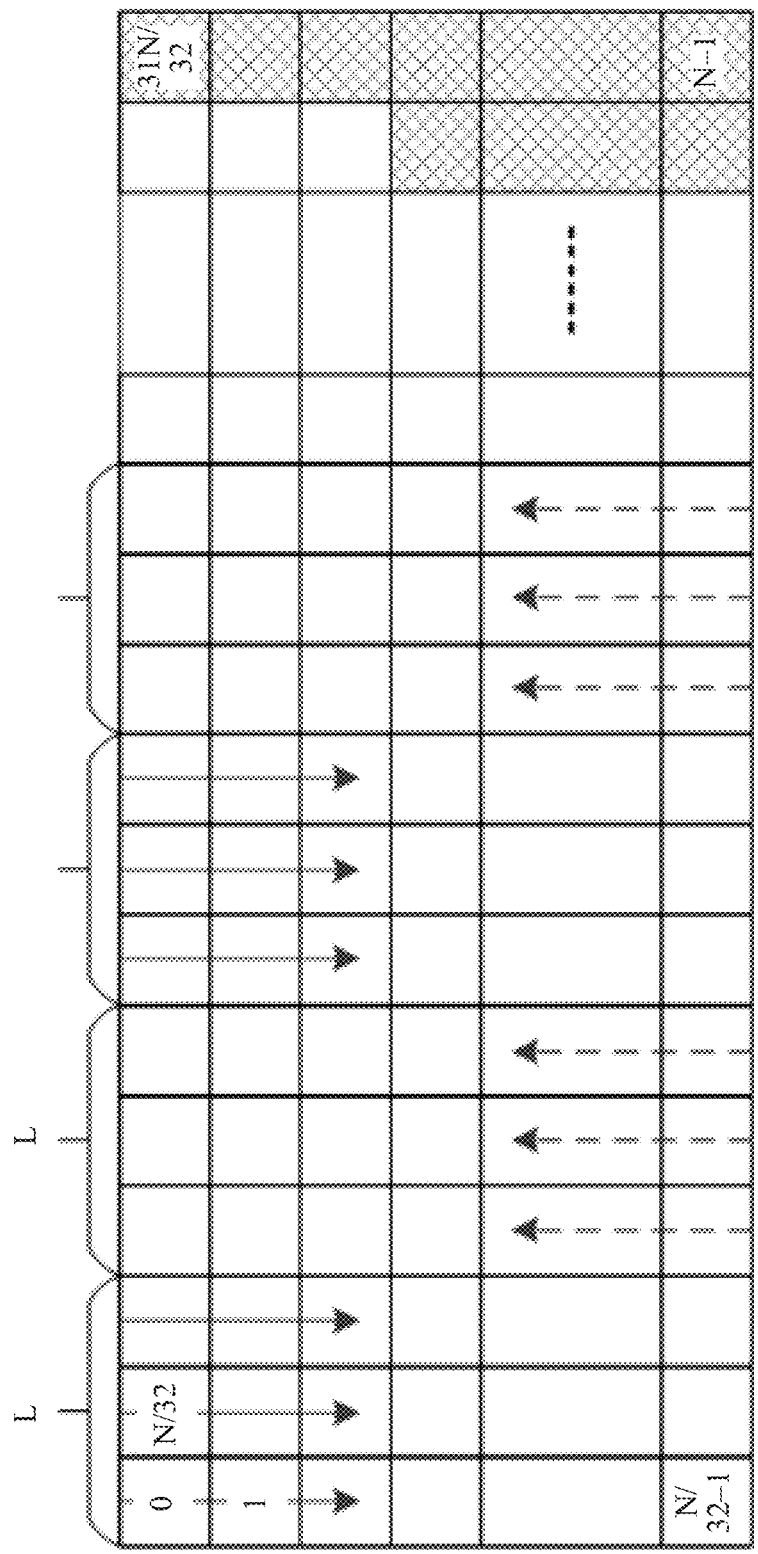
FIG. 8 is a schematic diagram of reading coded bits in a block interleaver by column according to an embodiment of this application.
Figure 9:
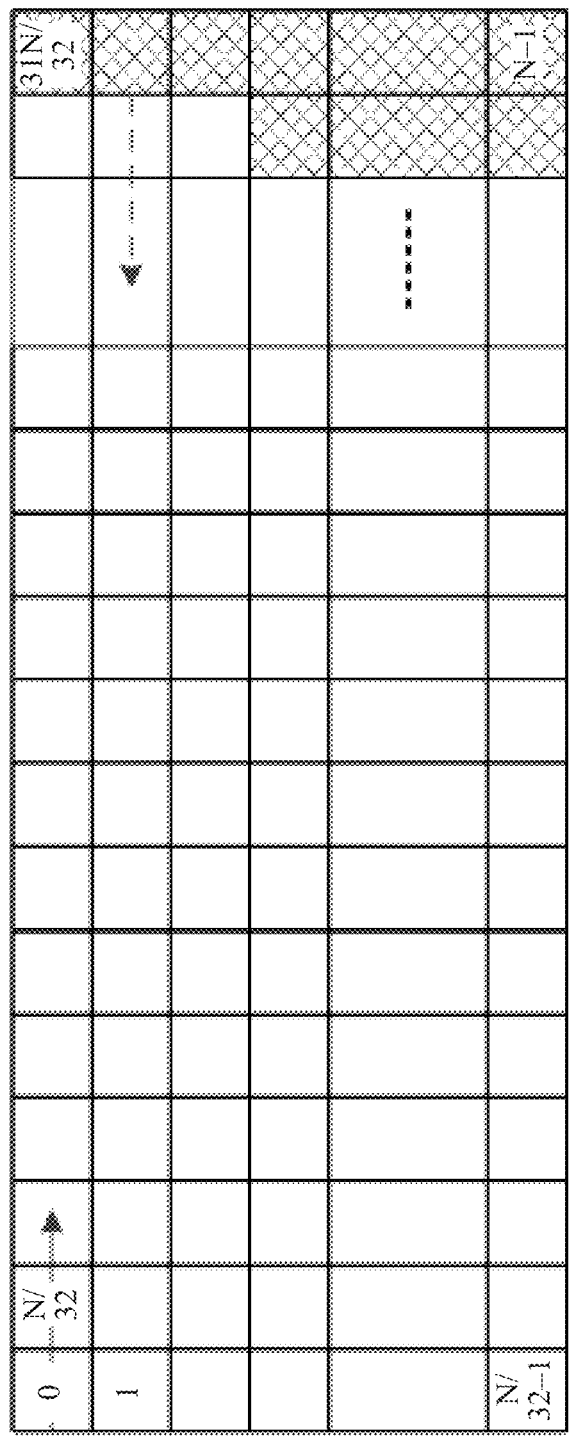
FIG. 9 is a schematic diagram of reading coded bits in a block interleaver by row according to an embodiment of this application.

A reading manner of the block interleaver may also be manners shown in FIG. 8 and FIG. 9. Reading is performed by column in FIG. 8, and reading is performed by row in FIG. 9. FIG. 8 and FIG. 9 use an example of shortening, and puncturing is similar. In a process of performing reading by column in FIG. 8, a column reading order is reversed every L columns. For example, column reading is first performed from top to bottom, and then column reading is performed from bottom to top. Herein, L may be a constant; or L may be related to a modulation order. For example, when the modulation order is 16 QAM, L may be 3, 5, or the like; when the modulation order is 64 QAM, L is 5, 6, 32, or the like. When L is the same as a quantity of columns, the reading order is not changed. In a process of performing reading by row in FIG. 9, row reading may be directly performed from left to right, or may be performed in a manner similar to the manner of performing reading by column. A reading order is reversed every several rows, in other words, reading is performed from right to left.

The following uses an example in which g=32, to describe a method for sequentially and alternately determining a puncturing/shortening pattern when 32 groups are obtained through division. Whether rate matching is performed by using a puncturing rate matching manner or a shortening rate matching manner is determined. Coded bits of a polar code are sequentially divided into 32 equal-length groups, and a quantity of coded bits in each group is N/32. A to-be-punctured/shortened bit position is determined in a unit of group based on a sequence S (whose length is 32). If a current element is one number, a group indicated by the element is punctured, and an inner-group puncturing order may be the same as the order described above. If a current element is two or more numbers in brackets, groups indicated by the numbers are alternately punctured, and an inner-group puncturing order may be the same as the order described above.

It is assumed that a sequence S whose length is 32 is as follows:

S=[0, 1, 2, 3, 4, (8, 16), 5, 6, 7, (9, 17), (10, 18), (11, 19), (12, 20), (13, 21), (14, 22), 24, 25, 26, (15, 23), 27, 28, 29, 30, 31].

The sequence indicates a number of a to-be-punctured group from front to back. In other words, a zeroth group is first punctured, and then a first group, a second group, and the like are successively punctured. After a fourth group is punctured, an eighth group and a $16^{th}$ group are alternately punctured, and then a fifth group is punctured. The sequence S indicates a number of a to-be-shortened group from back to front. In other words, a $31^{st}$ group is first shortened, and then a $30^{th}$ group, a $29^{th}$ group, and the like are shortened. S is symmetrical, and a reversed S is a shortening indication sequence from front to back.

Figure 10:
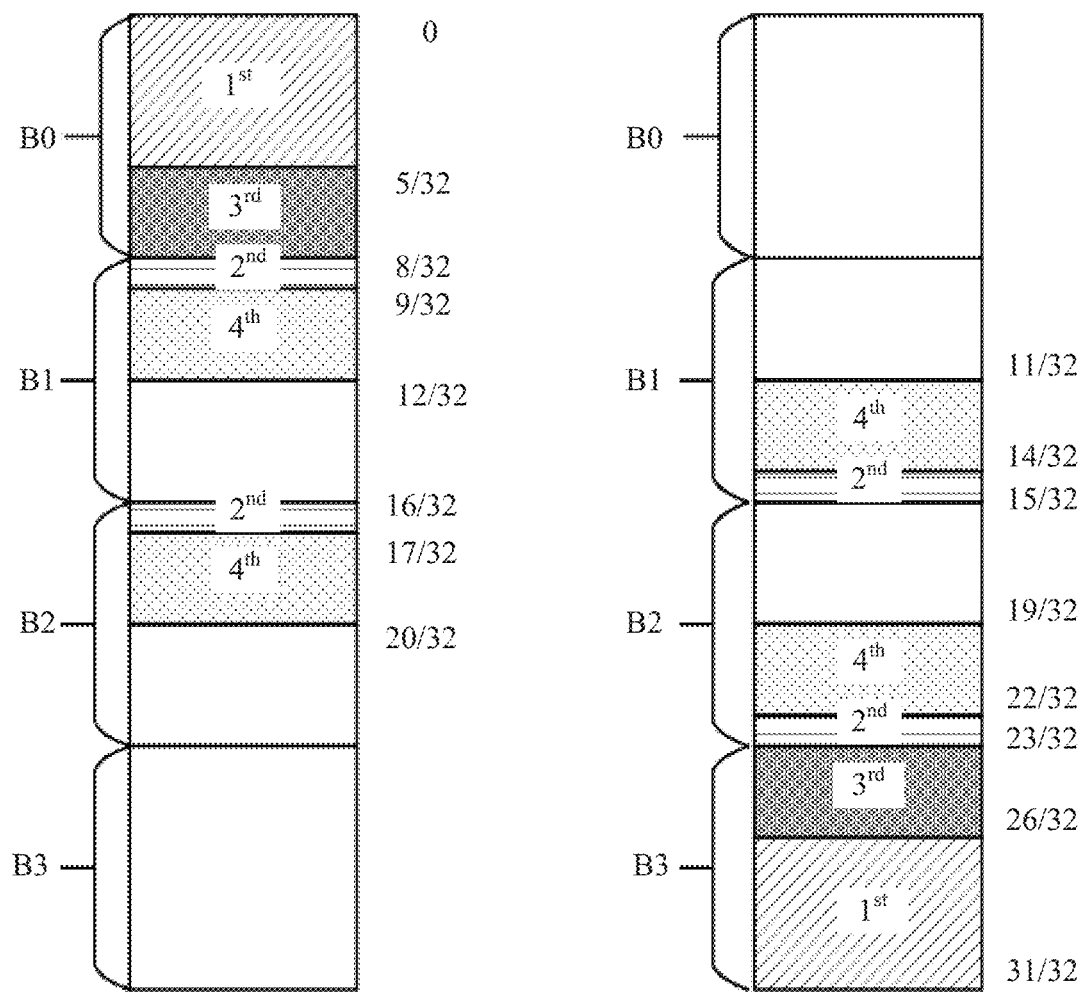
FIG. 10 is a schematic diagram of a puncturing/shortening pattern of 32 groups according to an embodiment of this application.

A puncturing order generated by the sequence is shown in FIG. 10. In the figure, a number at a right side is a group sequence number, and an area with lines is a candidate to-be-punctured bit. A number is a priority order of puncturing groups. An area with a smaller number is deleted earlier, and areas with a same number are alternately punctured. An inner-group puncturing/shortening order of bits may be a natural order. The puncturing order is a front-to-back order, and the shortening order is a back-to-front order. Alternatively, an inner-group puncturing/shortening order of bits may be an inner-group reliability order. To be specific, puncturing may be performed in ascending order of reliability, and shortening may be performed in descending order of reliability.

In FIG. 10, when a quantity of groups that need to be punctured is less than or equal to 5, a zeroth group to a fourth group are first sequentially punctured; when a quantity of groups that need to be punctured is six to seven, an eighth group and a $16^{th}$ group are alternately punctured after a zeroth group to a fourth group are punctured; when a quantity of groups that need to be punctured is eight to ten, a fifth group to a seventh group are sequentially punctured after the foregoing groups are punctured; when a quantity of segments that need to be punctured is greater than or equal to 11, alternate puncturing is successively performed on a ninth group and a $17^{th}$ group, a $10^{th}$ group and an $18^{th}$ group, and an $11^{th}$ group and a $19^{th}$ group after the foregoing groups are punctured. The three pairs (9, 17), (10, 18), and (11, 19) are closely adjacent, and therefore may also be represented as (9-11, 17-19). In other words, ninth to $11^{th}$ groups and $17^{th}$ to $19^{th}$ groups are alternately punctured. A to-be-punctured bit position indicated by the sequence may be determined by using a pseudo code in the following, where q indicates whether a bit is to be punctured. If q at a current bit position is 1, it indicates that the bit is to be punctured; otherwise, it indicates that a bit at the current bit position is not to be punctured.

If P≤N*5/32% sequentially puncturing zeroth to fourth groups
  q(1:P)=% zeroth to fourth groups
else if P≤N*7/32% alternately puncturing an eighth group and a $16^{th}$ group
  q(1:N*5/32)=1;
  q(N/4+(1:ceil((P−N*5/32)/2)))=1; % eighth group
  q(N/2+(1:floor((P−N*5/32)/2)))=1; % $16^{th}$ group
else if P≤N0*5/16% sequentially puncturing fifth to seventh segments
  q(1:N*5/32)=1;
  q(N/4+(1:N/32))=1;
  q(N/2+(1:N/32))=1;
  q(N*5/32+(1:P−N*7/32))=1; % fifth to seventh groups
Else % alternately puncturing ninth segment and a $17^{th}$ segment
  q(1:N/4)=1;
  q(N/4+(1:ceil((P−N/4)/2)))=1; % ninth to $11^{th}$ groups
  q(N/2+(1:floor((P−N/4)/2)))=1; % $17^{th}$ to $19^{th}$ groups
end In FIG. 10, a case of shortening is contrary to that of puncturing. When a quantity groups that need to be shortened is less than or equal to 5, a $31^{st}$ group, a $30^{th}$ group, a $29^{th}$ group, and a $27^{th}$ group (for ease of description, the consecutive groups in a reversed order may be represented as $31^{st}$ to $27^{th}$ groups) are first sequentially shortened. When a quantity groups that need to be shortened is 6 to 7, a $23^{rd}$ group and a $15^{th}$ group are alternately shortened after the $31^{st}$ to $27^{th}$ groups are shortened. When a quantity groups that need to be shortened is 8 to 10, $26^{th}$ to $24^{th}$ groups are sequentially shortened after the foregoing groups are shortened. When a quantity segments that need to be shortened is greater than or equal to 11, alternate shortening is successively performed on a $22^{nd}$ group and a $14^{th}$ group, a $21^{st}$ group and a $13^{th}$ group, and a $20^{th}$ group and a $12^{th}$ group after the foregoing groups are shortened. The three pairs (12, 20), (13, 21), (14, 22) are closely adjacent, and therefore may also be represented as (22-20, 14-12). In other words, $22^{nd}$ to $20^{th}$ groups and $14^{th}$ to $12^{th}$ groups are alternately shortened.

Figure 11:
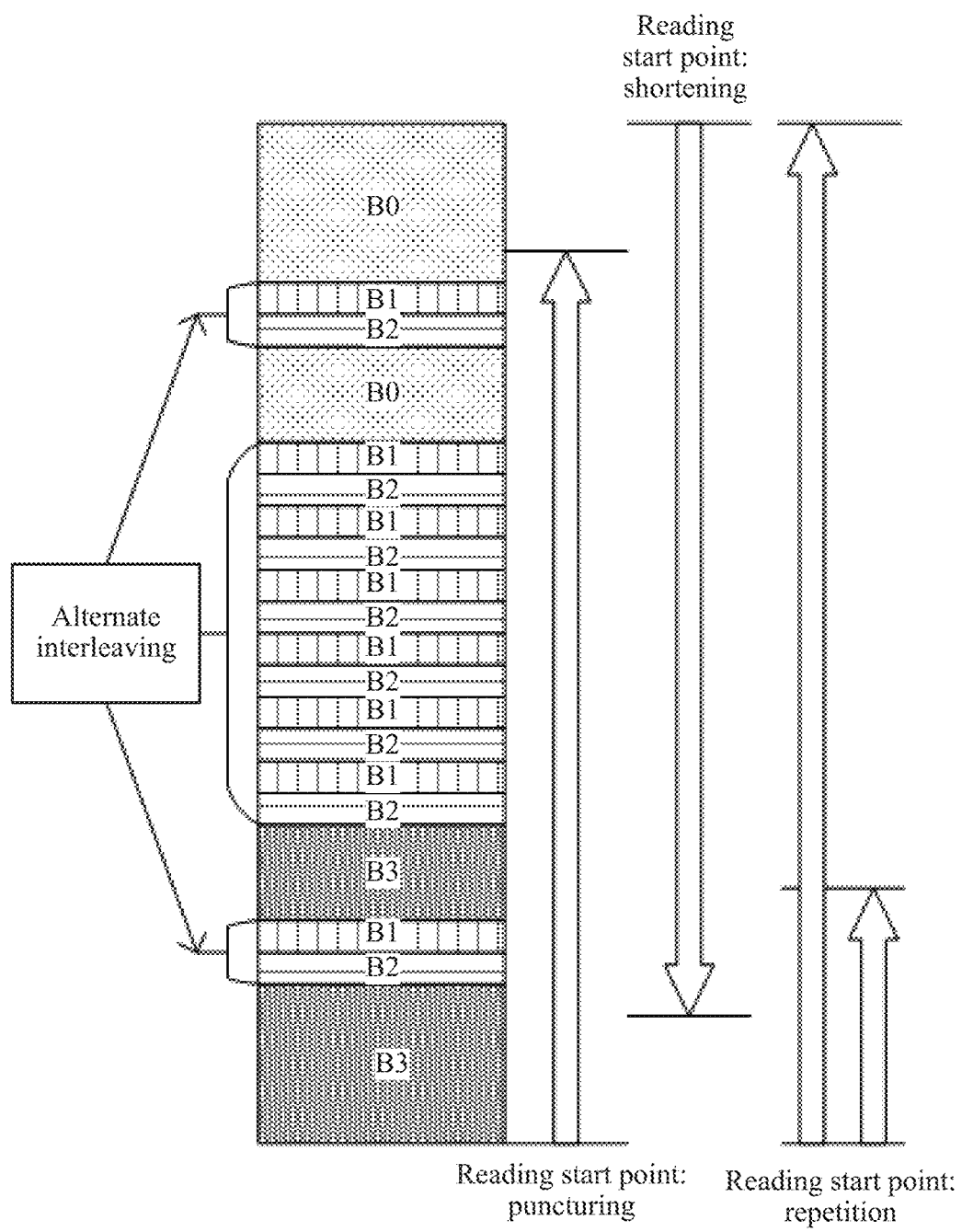
FIG. 11 is a schematic diagram of implementing sequential and alternate puncturing/shortening by using an interleaver according to an embodiment of this application.

As shown in FIG. 11, sequential and alternate rate matching may be implemented by using an interleaver. For example, g=32. Specific implementation of the interleave is as follows: sequentially placing first 1/4: zeroth to seventh groups of N coded bits and last 1/4: $24^{th}$ to $31^{st}$ groups of the N coded bits; two middle (1/4)s: eighth to $15^{nd}$ groups and $16^{th}$ to $23^{rd}$ groups of the N coded bits are alternately placed. Then, group permutation is performed based on the sequence S, to rearrange a group order. After the coded bits are interleaved, if puncturing is to be performed, to-be-punctured bits are gathered at an upmost side of the interleaver; if shortening is to be performed, to-be-shortened bits are gathered at a downmost side of the interleaver. Repetition may be implemented by performing cyclic reading on bits in the interleaver.

Figure 12:
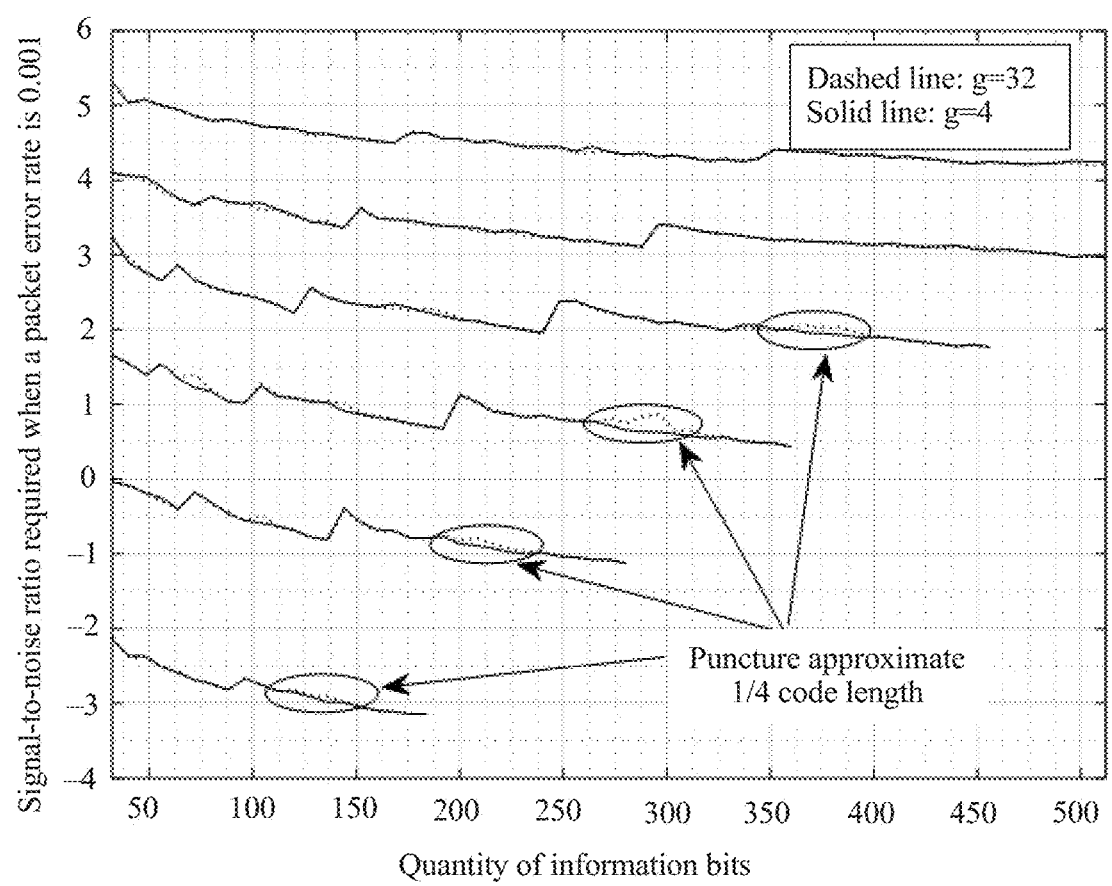
FIG. 12 shows a comparison between performance obtained by using a sequential and alternate rate matching scheme when g=32 and performance obtained by using the sequential and alternate rate matching scheme when g=4 according to an embodiment of this application.

FIG. 12 shows a comparison between performance obtained by using a sequential and alternate rate matching scheme of the foregoing sequence S when g=32 and performance obtained by using the sequential and alternate rate matching scheme when g=4. A horizontal coordinate is a quantity of information bits, and a vertical coordinate is a signal-to-noise ratio required when a block error rate is 0.001. A lower required signal-to-noise ratio indicates better performance. It can be learned from FIG. 12 that when a quantity of to-be-punctured/shortened bits is approximate to 1/4 code length, a puncturing/shortening pattern that is indicated by the foregoing symmetrical sequence and that is used when g=32 is obviously better than the pattern used when g=4.

Figure 13:
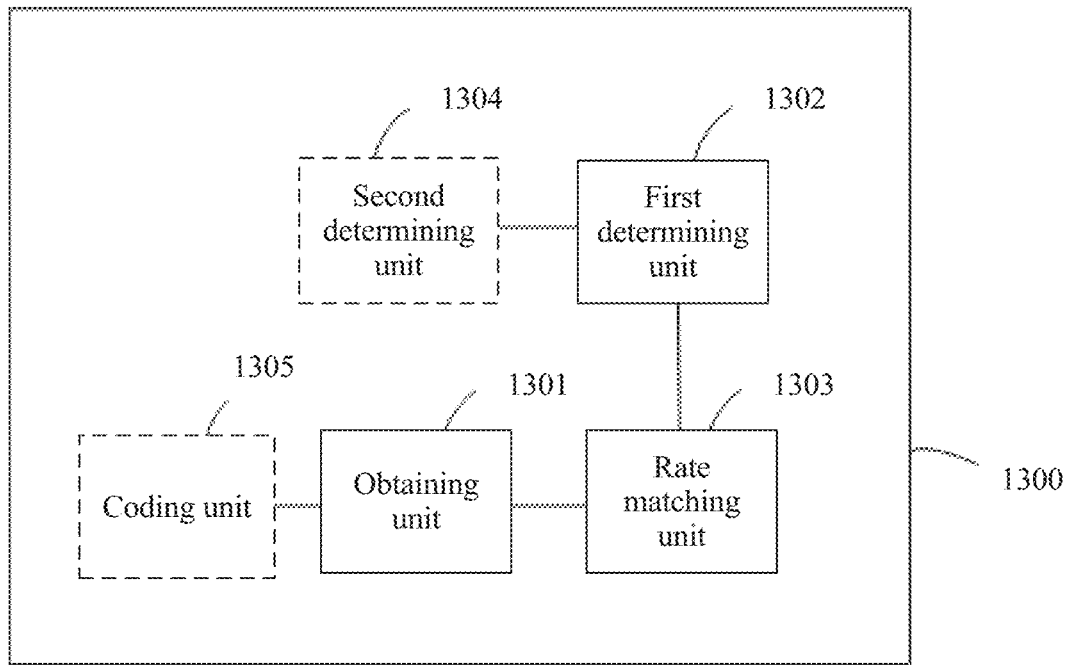
FIG. 13 is a schematic structural diagram of a rate matching apparatus 1300 according to an embodiment of this application.

FIG. 13 is a schematic structural diagram of a rate matching apparatus 1300 according to this application. The rate matching apparatus 1300 includes:
  an obtaining unit 1301, configured to obtain a coded bit sequence, where the coded bit sequence includes g equal-length groups, a quantity of coded bits in each group is N/g, N is a mother code length of a polar code, N is an integral power of 2, g is an integer greater than or equal to 4 and less than N, and g is an integral power of 2;

a first determining unit 1302, configured to determine, based on the groups, a bit position of a bit that needs to be punctured/shortened in the coded bit sequence; and a rate matching unit 1303, configured to obtain a coded bit in the coded bit sequence except the bit that needs to be punctured/shortened, to obtain a coded bit sequence obtained after rate matching.

Optionally, the coding apparatus further includes:

a second determining unit 1304, configured to: if an actual code rate is greater than a preset threshold, determine to use the shortening rate matching method; or if an actual code rate is less than or equal to a preset threshold, determine to use the puncturing rate matching method, where the actual code rate is K/M, K is a quantity of information bits, and M is the target code length.

Optionally, the coding apparatus further includes:

a encoding unit 1305, configured to: place a frozen bit on a polarized channel corresponding to the bit position of the bit that needs to be punctured/shortened; in remaining polarized channels, select a polarized channel with high reliability, place an information bit on the polarized channel with high reliability, and place frozen bits on the other polarized channels; and map a to-be-coded bit to the information bit for channel coding, to obtain the coded bit sequence.

The obtaining unit 1301 may be configured to perform step 402 in FIG. 4 and a specific method in which step 402 is related in this application. The first determining unit 1302 may be configured to perform step 403 in FIG. 4 and a specific method in which step 403 is related in this application. The rate matching unit 1303 may be configured to perform step 404 in FIG. 4 and a specific method in which step 404 is related in this application. The second determining unit 1304 may be configured to perform step 401 in FIG. 4 and a specific method in which step 401 is related in this application.

Figure 14:
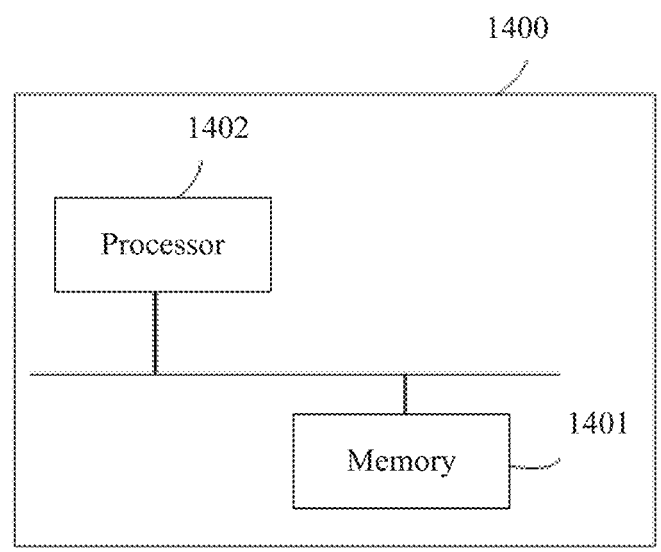
FIG. 14 is a schematic structural diagram of another e matching apparatus 1400 according to this application.

FIG. 14 is a schematic structural diagram of another rate matching apparatus 1400 according to this application. The rate matching apparatus 1400 includes:

a memory 1401, configured to store a program; and a processor 1402, configured to execute the program stored in the memory, where when the program is executed, the processor 1402 performs the rate matching method described in the embodiments of this application.

The rate matching apparatus 1300 and the rate matching apparatus 1400 may be configured to perform the rate matching method described in this application. For content about a manner of determining a bit position of a to-be-punctured/shortened bit, a puncturing/shortening pattern, an application method of the puncturing/shortening pattern, how to determine a rate matching manner, and the like, refer to the embodiments of the rate matching method described above. Details are not described herein again.

Figure 15:
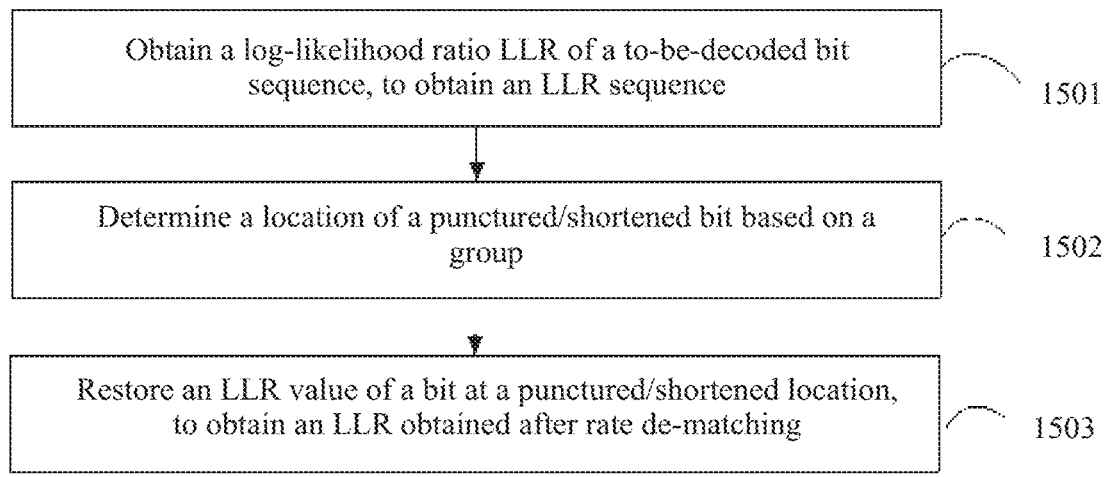
FIG. 15 is a schematic flowchart of a polar code rate de-matching method according to an embodiment of this application.

A receive end performs a corresponding reverse operation in a rate de-matching process. An LLR corresponding to a punctured/shortened bit position is restored, and is respectively set to 0 or infinitely large, to implement rate de-matching. As shown in FIG. 15, this application provides a rate de-matching method, including the following steps:

1501. Obtain a log-likelihood ratio LLR of a to-be-decoded bit sequence, to obtain an LLR sequence.

1502. Determine a bit position of a punctured/shortened bit based on groups.

1503. Restore an LIR value of a bit at the punctured/shortened bit position, to obtain a log-likelihood ratio (LLR) sequence obtained after rate de-matching, where the LLR sequence obtained after rate de-matching includes g equal-length groups, a quantity of LLRs in each group is N/g, N is a mother code length of a polar code, N is an integral power of 2, g is an integer greater than or equal to 4 and less than N, and g is an integral power of 2.

Rate de-matching is a reverse process of rate matching. In the rate de-matching process, the bit position of the punctured/shortened bit is determined in manner the same as or corresponding to a rate matching manner performed by a transmit end. For example, a same puncturing/shortening pattern (for example, a same sequence S) is used, and a quantity of groups is also the same as a rule of the transmit end. In the rate de-matching process, it is determined that a puncturing/shortening rate matching manner is also the same as a puncturing/shortening rate matching manner of the transmit end. A corresponding rate matching manner may be determined based on an actual code rate, and a rate de-matching manner corresponding to the rate matching manner is used to determine the bit position of the punctured/shortened bit and correspondingly restore the LLR. A process of de-interleaving the restored LLR is a reverse process at the transmit end. For such specific content, refer to the description of the rate matching method embodiments.

Figure 16:
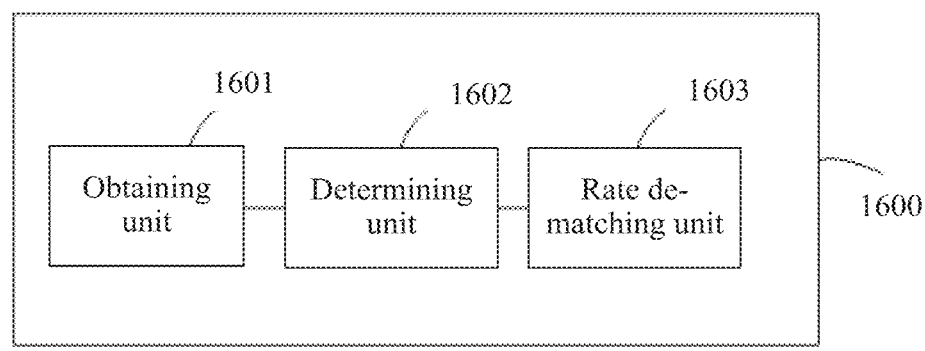
FIG. 16 is a schematic structural diagram of a rate de-matching apparatus according to an embodiment of this application.

FIG. 16 shows a rate de-matching apparatus 1600 according to this application, including:

an obtaining unit 1601, configured to obtain a log-likelihood ratio LLR of a to-be-decoded bit sequence, to obtain an LLR sequence;

a determining unit 1602, configured to determine a punctured/shortened bit position based on groups; and a rate de-matching unit 1603, configured to restore an LLR value of a bit at the punctured/shortened bit position, to obtain an LLR sequence obtained after rate de-matching, where the LLR sequence obtained after rate de-matching includes g equal-length groups, a quantity of LLRs in each group is N/g, N is a mother code length of a polar code, N is an integral power of 2, g is an integer greater than or equal to 4 and less than N, and g is an integral power of 2.

Figure 17:
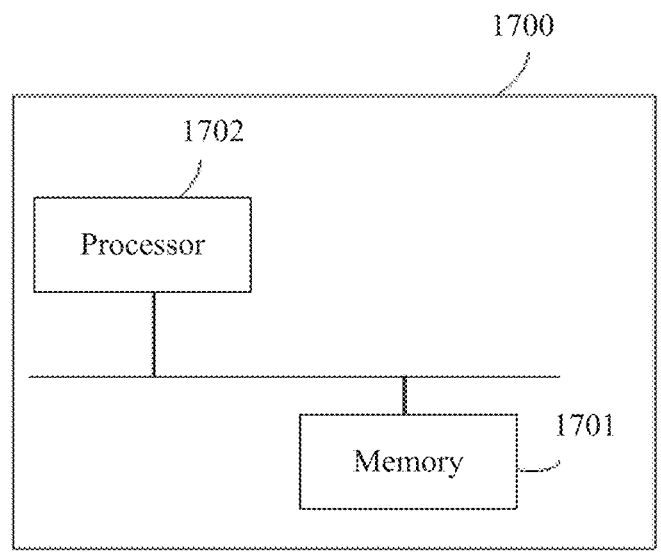
FIG. 17 is a schematic structural diagram of another rate de-matching apparatus according to an embodiment of this application.

FIG. 17 shows another rate de-matching apparatus 1700 according to this application, including:

a memory 1701, configured to store a program;

a processor 1702, configured to execute the program stored in the memory, where when the program is executed, the processor is configured to perform the rate de-matching method provided in the embodiments of this application.

The rate de-matching apparatus 1600 and the rate de-matching apparatus 1700 may be configured to perform the rate de-matching method described in this application. For content about a manner of determining a bit position of a punctured/shortened bit, a puncturing/shortening pattern, an application method of the puncturing/shortening pattern, how to determine a rate matching manner, and the like, refer to the embodiments of the rate matching method and the embodiments of the rate de-matching method described above. Details are not described herein again.

Figure 18:
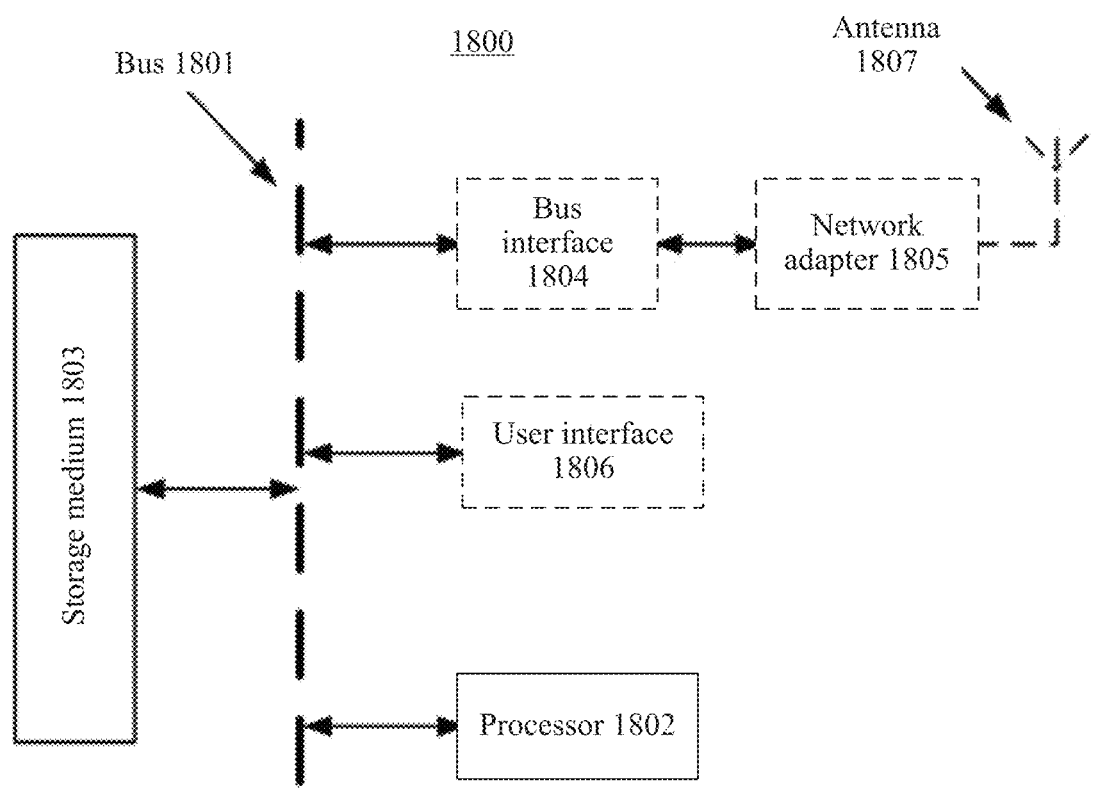
FIG. 18 is a schematic structural diagram of a communications apparatus according to an embodiment of this application.

FIG. 18 is a schematic structural diagram of a communications apparatus 1800 according to an embodiment of this application (for example, a communications apparatus such as an access point, a base station, a station, or a terminal). As shown in FIG. 18, the communications apparatus 1800 may be implemented by using a bus 1801 as a general bus architecture. The bus 1801 may include any quantity of interconnected buses and bridges based on specific application and an overall design constraint condition of the communications apparatus 1800. The bus 1801 connects various circuits together. These circuits include a processor 1802, a storage medium 1803, and a bus interface 1804. The storage medium is configured to store an operating system, to-be-sent data, and received data. Optionally, in the communications apparatus 1800, a network adapter 1805 and the like are connected by using the bus 1801 and the bus interface 1804. The network adapter 1805 may be configured to implement a signal processing function of a physical layer in a wireless communications network, and send and receive a radio frequency signal by using an antenna 1807. A user interface 1806 may be connected to various user input devices such as a keyboard, a display, a mouse, or a joystick. The bus 1801 may further connect various other circuits such as a timing source, a peripheral device, a voltage regulator, or a power management circuit. These circuits are well-known in the art, and are not described in detail herein.

The processor 1802 is responsible for managing the bus and general processing (including executing software stored in a storage medium 1803). The processor 1802 may be implemented by using one or more general-purpose processors and/or dedicated processors. Examples of the processor include a microprocessor, a microcontroller, a DSMP processor, and other circuits that can execute software. The software should be broadly construed as representation of instructions, data, or any combination thereof regardless of whether the software is referred to as software, firmware, middleware, microcode, a hardware description language, or others.

As shown in FIG. 18, the storage medium 1803 is separated from the processor 1802. However, persons skilled in the art easily understand that the storage medium 1803 or any part of the storage medium 1803 may be located outside the communications apparatus 1800. For example, the storage medium 1803 may include a transmission line, a carrier waveform modulated by using data, and/or a computer product separated from a wireless node. These media may be accessed by the processor 1802 by using the bus interface 1804. Alternatively, the storage medium 1803 or any part thereof may be integrated into the processor 1802, for example, may be a cache and/or a general-purpose register.

The processor 1802 may be configured to perform the rate matching method or the rate de-matching method described in the embodiments of this application. An execution process of the processor 1802 is not described herein again.

In actual use, the rate matching apparatus and the rate de-matching apparatus described in the embodiments of this application may be separately independent devices, or may be an integrated device. The device may be used as a transmit end to perform the rate matching method, and may be used as a receive end to perform the rate de-matching method.

In the examples described in the embodiments of this application, units and method processes can be implemented by electronic hardware or a combination of computer software and electronic hardware. Whether the functions are performed by hardware or software depends on particular applications and design constraint conditions of the technical solutions. Persons skilled in the art may use a different method for each specific application to implement the described functions.

In the several embodiments provided in this application, it should be understood that the disclosed apparatus and method may be implemented in other manners. The described apparatus embodiments are merely an example. For example, the unit division is merely logical function division and may be other division in actual implementation. For example, a plurality of units or components may be combined or may be integrated into another system. Some steps in the method may be ignored or not performed. In addition, coupling, direct coupling, or a communication connection between the units may be implemented by using some interfaces, and these interfaces may be in an electronic form, a mechanical form, or another form.

The units described as separate parts may or may not be physically separate, and may be located in one place or may be distributed on a plurality of network units. In addition, functional units in the embodiments of this application may be integrated into one processing unit, or each of the units may exist alone physically, or two or more units are integrated into one unit.

All or some of the foregoing embodiments may be implemented by using software, hardware, firmware, or any combination thereof. When the embodiments are implemented by using software, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or another programmable apparatus. The computer instruction may be stored in a computer readable storage medium, or may be transmitted by using the computer readable storage medium. The computer instructions may be transmitted from a website, a computer, a server or a data center in a wired manner (for example, a coaxial cable, an optical fiber, or digital subscriber line (DSL)) or a wireless (for example, infrared, wireless, or microwave) manner to another website, computer, server, or data center. The computer-readable storage medium may be any usable medium accessible by a computer, or a data storage device such as a server or a data center into which one or more usable media are integrated. The usable medium may be a magnetic medium (for example, a floppy disk, a hard disk, a magnetic tape, a USB flash drive, a ROM, or a RAM), an optical medium (for example, a CD or a DVD), a semiconductor medium (for example, a solid state disk (SSD)), or the like.

The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A rate matching method, comprising:
obtaining a Polar encoded bit sequence, wherein the Polar encoded bit sequence has a code length of N, and N is an integer power of 2, and N is greater than or equal to 32;

dividing the Polar encoded bit sequence into g groups, a length of each group is N/g, wherein g is 32;
block interleaving the g groups to obtain an interleaved bit sequence, wherein the interleaved bit sequence comprises g groups of bits, the g groups are ordered according to a sequence S after the block interleaving, each element in the sequence S indicates a group number after the block interleaving;
rate matching the interleaved bit sequence to obtain a rate matched bit sequence; and
transmitting the rate matched bit sequence;
wherein when a transmission code rate R is greater than a code rate threshold R0, the rate matching the interleaved bit sequence to obtain the rate matched bit sequence comprises: shortening (N-M) bits from end of the interleaved bit sequence to obtain the rate matched bit sequence;
wherein when a transmission code rate R is less than or equal to a code rate threshold R0, the rate matching the interleaved bit sequence to obtain the rate matched bit sequence comprises: puncturing (N-M) bits from beginning of the interleaved bit sequence obtain the rate matched bit sequence;
wherein R=K/M and M is a positive integer smaller than N, K is positive integer, and wherein a value of the R0 is a less than 1/2 and not less than 2/5.

2. The rate matching method according to claim 1, wherein bit positions of first g/2 groups elements in the sequence S are symmetrical to bit positions of last g/2 groups elements in the sequence S.

3. The rate matching method according to claim 1, wherein elements in the sequence S are ordered in a priority order of puncturing or shortening the g groups.

4. The rate matching method according to claim 1, further comprising:
generating a binary row vector $u_1^N$ wherein $u_1^N=(u_1, u_2, \ldots, u_N)$, and K bit-positions of the binary row vector $u_1^N$ are occupied by K information bits; and
encoding the binary row vector $u_1^N$ according an encoding formula, to obtain the encoded bit sequence;
wherein the encoding formula is:

$$x_1^N = u_1^N G_N,$$

wherein $x_1^N=(x_1, x_2, \ldots, x_N)$ is the encoded bit sequence, and $G_N$ is a polar code generating matrix of N row and N columns.

5. A device in a wireless communication network, comprising:
a transmitter;
a non-transitory memory storage comprising instructions; and
one or more hardware processors in communication with the non-transitory memory storage, wherein the one or more hardware processors execute the instructions to:
obtain a Polar encoded bit sequence, wherein the Polar encoded bit sequence has a code length of N, and N is an integer power of 2, and N is greater than or equal to 32;
divide the Polar encoded bit sequence into g groups, a length of each group is N/g, wherein g is 32; block interleave the g groups to obtain an interleaved bit sequence, wherein the interleaved bit sequence comprises g groups of bits, the g groups are ordered according to a sequence S after the block interleaving, each element in the sequence S indicates a group number after the block interleaving;
shorten (N-M) bits from end of the interleaved bit sequence to obtain a rate matched bit sequence when a transmission code rate R is greater than a code rate threshold R0; or puncturing (N-M) bits from beginning of the interleaved bit sequence to obtain the rate matched bit sequence when a transmission code rate R is less than or equal to the code rate threshold R0;
wherein R=K/M and M is a positive integer smaller than N, K is positive integer, and wherein a value of the R0 is a greater than 1/2 and not greater than 2/5;
transmit, by using the transmitter and over a wireless network, a signal that comprises the rate matched bit sequence.

6. The device according to claim 5, wherein bit positions of first g/2 groups elements in the sequence S are symmetrical to bit positions of last g/2 groups elements in the sequence S.

7. The device according to claim 5, wherein elements in the sequence S are ordered in a priority order of puncturing or shortening the g groups.

8. The device according to claim 5, further comprising:
generate a binary row vector $u_1^N$, wherein $u_1^N=(u_1, u_2, \ldots, u_N)$, and K bit-positions of the binary row vector are occupied by K information bits; and
encoding the binary row vector $u_1^N$ according an encoding formula, to obtain the encoded bit sequence;
wherein the encoding formula is:

$$x_1^N = u_1^N G_N,$$

wherein $x_1^N=(x_1, x_2, \ldots, x_N)$ is the encoded bit sequence, and $G_N$ is a polar code generating matrix of N row and N columns.

9. The device according to claim 5, wherein the device is a base station or a user terminal.

10. A device in a wireless communication network, comprising:
a processor and a memory storing program instructions for execution;
wherein, the processor is configured to execute the program instructions to perform operations comprising:
obtaining a Polar encoded bit sequence, wherein the Polar encoded bit sequence has a code length of N, and N is an integer power of 2, and N is greater than or equal to 32;
dividing the Polar encoded bit sequence into g groups, a length of each group is N/g, wherein g is 32;
block interleaving the g groups to obtain an interleaved bit sequence, wherein the interleaved bit sequence comprises g groups of bits, the g groups are ordered according to a sequence S after the block interleaving, each element in the sequence S indicates a group number after the block interleaving;
rate matching the interleaved bit sequence to obtain a rate matched bit sequence; and
transmitting the rate matched bit sequence;
wherein when a transmission code rate R is greater than a code rate threshold R0, the rate matching the interleaved bit sequence to obtain the rate matched bit sequence comprises:
shortening (N-M) bits from end of the interleaved bit sequence to obtain the rate matched bit sequence;
wherein when a transmission code rate R is less than or equal to a code rate threshold R0, the rate matching the interleaved bit sequence to obtain the rate matched bit sequence comprises:
puncturing (N-M) bits from beginning of the interleaved bit sequence obtain the rate matched bit sequence;

wherein R=K/M and M is a positive integer smaller than N, K is positive integer, and wherein a value of the R0 is a less than 1/2 and not less than 2/5.

11. The device according to claim 10, wherein the device is a base station or a user terminal.

12. A non-transitory computer readable medium storing program codes thereon for execution by one or more processors in a communication device, wherein the program codes, when executed by the one or more processors, cause the communication device to perform operations comprising obtaining a Polar encoded bit sequence, wherein the Polar encoded bit sequence has a code length of N, and N is an integer power of 2, and N is greater than or equal to 32;

dividing the Polar encoded bit sequence into g groups, a length of each group is N/g, wherein g is 32;

block interleaving the g groups to obtain an interleaved bit sequence, wherein the interleaved bit sequence comprises g groups of bits, the g groups are ordered according to a sequence S after the block interleaving, each element in the sequence S indicates a group number after the block interleaving;

rate matching the interleaved bit sequence to obtain a rate matched bit sequence; and transmitting the rate matched bit sequence;

wherein when a transmission code rate R is greater than a code rate threshold R0, the rate matching the interleaved bit sequence to obtain the rate matched bit sequence comprises:

shortening (N-M) bits from end of the interleaved bit sequence to obtain the rate matched bit sequence;

wherein when a transmission code rate R is less than or equal to a code rate threshold R0, the rate matching the interleaved bit sequence to obtain the rate matched bit sequence comprises:

puncturing (N-M) bits from beginning of the interleaved bit sequence obtain the rate matched bit sequence;

wherein R=K/M and M is a positive integer smaller than N, K is positive integer, and wherein a value of the R0 is a less than 1/2 and not less than 2/5.

* * * * *

UNITED STATES PATENT AND TRADEMARK OFFICE
CERTIFICATE OF CORRECTION

PATENT NO. : 11,689,220 B2
APPLICATION NO. : 17/563573
DATED : June 27, 2023
INVENTOR(S) : Gongzheng Zhang et al.

It is certified that error appears in the above-identified patent and that said Letters Patent is hereby corrected as shown below:

In the Claims

Column 27 / Line 36 - In Claim 4, delete "$u_1^N$" and insert -- $u_1^N$, --.

Column 28 / Line 34 - In Claim 8, after "vector" insert -- $u_1^N$ --.

Signed and Sealed this
Twelfth Day of September, 2023

Katherine Kelly Vidal
*Director of the United States Patent and Trademark Office*